US012660652B2

(12) United States Patent
Park et al.

(10) Patent No.: US 12,660,652 B2
(45) Date of Patent: Jun. 16, 2026

(54) PACKAGE BASE SUBSTRATE AND SEMICONDUCTOR PACKAGE INCLUDING THE SAME

(71) Applicant: Samsung Electronics Co., Ltd., Suwon-si (KR)

(72) Inventors: Minkyeong Park, Hwaseong-si (KR); Yongsung Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 565 days.

(21) Appl. No.: 18/076,137

(22) Filed: Dec. 6, 2022

(65) Prior Publication Data

US 2023/0223327 A1     Jul. 13, 2023

(30) Foreign Application Priority Data

Jan. 7, 2022     (KR) ......................... 10-2022-0002957

(51) Int. Cl.
*H01L 23/498*       (2006.01)
*H01L 25/065*       (2023.01)
                (Continued)

(52) U.S. Cl.
CPC ........... *H10W 70/65* (2026.01); *H10W 90/00* (2026.01); *H10W 90/701* (2026.01);
                (Continued)

(58) Field of Classification Search
CPC ......... H01L 23/49838; H01L 23/49816; H01L 24/16; H01L 24/32; H01L 24/33; H01L 24/48; H01L 24/49; H01L 25/0657
See application file for complete search history.

(56) References Cited

U.S. PATENT DOCUMENTS 6,678,948 B1 *   1/2004   Benzler .................. H01L 24/81
                                                       228/103
7,492,146 B2      2/2009   Behziz
                  (Continued)

FOREIGN PATENT DOCUMENTS

| JP | 2013-004919 A | 1/2013 |
| KR | 10-2009-0059173 A | 6/2009 |
| KR | 10-2009-0115136 A | 11/2009 |

*Primary Examiner* — Walter H Swanson
(74) *Attorney, Agent, or Firm* — Muir Patent Law, PLLC

(57)                ABSTRACT

A package base substrate includes a base layer; a plurality of lower surface connection pads disposed on a lower surface of the base layer; a plurality of lower surface wiring patterns disposed on a lower surface of the base layer and respectively connected to a set of lower surface connection pads of the plurality of lower surface connection pads; and a lower surface solder resist layer covering a portion of each of the plurality of lower surface connection pads and the plurality of lower surface wiring patterns on a lower surface of the base layer, wherein each of at least some of the lower surface connection pads of the set of lower surface connection pads has a teardrop shape in a plan view, and includes a ball land portion having a planar circular shape, including a terminal contact portion exposed without being covered by the lower surface solder resist layer, and an edge portion surrounding the terminal contact portion and covered by the lower surface solder resist layer; and a connection reinforcement portion between the ball land portion and the lower surface wiring pattern, including an extension line portion having a width that is the same as a line width of the lower surface wiring pattern and extending from the ball land portion to the lower surface wiring pattern, and a corner reinforcement portion filling a corner between the ball land portion and the extension line portion, and wherein an extension length of the extension line portion has a value greater than a radius of the terminal contact portion.

20 Claims, 36 Drawing Sheets

(51) Int. Cl.

| | |
|---|---|
| H10W 70/65 | (2026.01) |
| H10W 90/00 | (2026.01) |
| H10W 70/685 | (2026.01) |
| H10W 72/00 | (2026.01) |
| H10W 72/30 | (2026.01) |
| H10W 72/50 | (2026.01) |
| H10W 74/15 | (2026.01) |
| H10W 90/20 | (2026.01) |
| H10W 90/24 | (2026.01) |
| H10W 90/28 | (2026.01) |

(52) U.S. Cl.
CPC .... *H10W 70/685* (2026.01); *H10W 72/07352* (2026.01); *H10W 72/07552* (2026.01); *H10W 72/07553* (2026.01); *H10W 72/321* (2026.01); *H10W 72/327* (2026.01); *H10W 72/521* (2026.01); *H10W 72/527* (2026.01); *H10W 72/537* (2026.01); *H10W 72/865* (2026.01); *H10W 72/877* (2026.01); *H10W 72/884* (2026.01); *H10W 74/15* (2026.01); *H10W 90/20* (2026.01); *H10W 90/24* (2026.01); *H10W 90/28* (2026.01); *H10W 90/297* (2026.01); *H10W 90/722* (2026.01); *H10W 90/724* (2026.01); *H10W 90/732* (2026.01); *H10W 90/734* (2026.01); *H10W 90/752* (2026.01); *H10W 90/754* (2026.01)

(56) References Cited

U.S. PATENT DOCUMENTS

| | | | |
|---|---|---|---|
| 7,544,899 | B2 | 6/2009 | Kamada et al. |
| 7,615,709 | B2 | 11/2009 | Goergen |
| 7,906,733 | B2 | 3/2011 | Kumakura |
| 9,125,332 | B2 | 9/2015 | Pendse et al. |
| 9,307,640 | B2 | 4/2016 | Sigle |

* cited by examiner

FIG. 2A

PACKAGE BASE SUBSTRATE AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2022-0002957, filed on Jan. 7, 2022, in the Korean Intellectual Property Office, the disclosure of which is incorporated by reference herein in its entirety.

BACKGROUND

The inventive concept relates to a package base substrate and a semiconductor package including the package base substrate, and more particularly, to a package base substrate to which a plurality of semiconductor chips are stacked and attached thereto, and to a semiconductor package including the same.

The electronics industry is developing rapidly, and in order to meet the needs of users, electronic devices are becoming smaller and lighter. Therefore, high-density and high-capacity semiconductor devices, which are core components of electronic devices, are being used, but the limit for high integration of semiconductor devices is getting close to being reached. Accordingly, a semiconductor package including a plurality of semiconductor chips has been developed in order to achieve high capacity.

In addition, as the demand for increasing the capacity of the semiconductor device further increases, a semiconductor package in which a plurality of semiconductor chips included in the semiconductor package are stacked has been developed.

SUMMARY

Aspects of the inventive concept provide a semiconductor package with improved reliability by preventing defects occurring in a package base substrate on which a plurality of semiconductor chips are stacked. Aspects of the inventive concept provide a package base substrate in which reliability may be secured, and a semiconductor package including the package base substrate.

The inventive concept provides a package base substrate and a semiconductor package including the package base substrate.

According to an aspect of the inventive concept, a package base substrate includes a base layer; a plurality of lower surface connection pads disposed on a lower surface of the base layer; a plurality of lower surface wiring patterns disposed on a lower surface of the base layer and respectively connected to a set of lower surface connection pads of the plurality of lower surface connection pads; and a lower surface solder resist layer covering a portion of each of the plurality of lower surface connection pads and the plurality of lower surface wiring patterns on a lower surface of the base layer, wherein each of at least some of the lower surface connection pads of the set of lower surface connection pads has a teardrop shape in a plan view, and includes a ball land portion having a planar circular shape, including a terminal contact portion exposed without being covered by the lower surface solder resist layer, and an edge portion surrounding the terminal contact portion and covered by the lower surface solder resist layer; and a connection reinforcement portion between the ball land portion and the lower surface wiring pattern, including an extension line portion having a width that is the same as a line width of the lower surface wiring pattern and extending from the ball land portion to the lower surface wiring pattern, and a corner reinforcement portion filling a corner between the ball land portion and the extension line portion, and wherein an extension length of the extension line portion has a value greater than a radius of the terminal contact portion.

According to another aspect of the inventive concept, a package base substrate includes: at least one base layer; a plurality of upper surface connection pads disposed on an upper surface of the at least one base layer and electrically connected to a first semiconductor chip and a second semiconductor chip stacked on the first semiconductor chip; a plurality of lower surface connection pads disposed on a lower surface of the at least one base layer and to which a plurality of external connection terminals are respectively attached; a plurality of lower surface wiring patterns disposed on a lower surface of the at least one base layer and respectively connected to a set of lower surface connection pads of the plurality of lower surface connection pads; and a lower surface solder resist layer covering a lower surface of the at least one base layer and exposing a portion of each of the plurality of lower surface connection pads by not covering the a portion of each of the plurality of lower surface connection pads, wherein the package base substrate has a chip attach region including an adhering region to which the first semiconductor chip is attached and a portion around the adhering region, and a peripheral region surrounding the chip attach region, wherein the plurality of lower surface connection pads include a plurality of function pads, at least one non-function pad, and at least one non-contact pad, wherein each of the plurality of lower surface connection pads has a ball land portion having a planar circular shape, including a terminal contact portion exposed without being covered by the lower surface solder resist layer, and an edge portion surrounding the terminal contact portion and covered by the lower surface solder resist layer, wherein among the plurality of function pads, at least one function pad is disposed in the chip attach region and includes a first connection reinforcement portion between the ball land portion and the lower surface wiring pattern, including a first extension line portion and a first corner reinforcement portion filling an corner between the ball land portion and the extension line portion, and wherein a first extension length of the first extension line portion has a value greater than a radius of the terminal contact portion.

According to another aspect of the inventive concept, a semiconductor package includes: a package base substrate having a chip attach region and a peripheral region surrounding the chip attach region; and a plurality of semiconductor chips including a first semiconductor chip that is the lowermost attached to the package base substrate at the chip attach region and a second semiconductor chip that is the second lowermost and is attached to the first semiconductor chip, wherein the package base substrate includes at least one base layer; a plurality of upper surface connection pads disposed on an upper surface of the at least one base layer and electrically connected to the plurality of semiconductor chips; a plurality of lower surface connection pads disposed on a lower surface of the at least one base layer; a plurality of lower surface wiring patterns disposed on a lower surface of the at least one base layer and respectively connected to a set of the plurality of lower surface connection pads; a lower surface solder resist layer covering the lower surface of the at least one base layer and exposing a portion of each of the plurality of lower surface connection pads by not covering the portion of each of the plurality of lower surface connection pads, wherein at least some of the plurality of lower surface connection pads of the set of the plurality of lower surface connection pads have a teardrop shape in a plan view and include a ball land portion having a planar circular shape, including a terminal contact portion exposed without being covered by the lower surface solder resist layer, and an edge portion surrounding the terminal contact portion and covered by the lower surface solder resist layer; a connection reinforcement portion between the ball land portion and the lower surface wiring pattern, including an extension line portion having the same width as a line width of the lower surface wiring pattern and extending from the ball land portion to the lower surface wiring pattern, and two corner reinforcement portions, each filling a corner between the ball land portion and the extension line portion on a respective side of the extension line portion, and wherein an extension length of the extension line portion has a value greater than a radius of the terminal contact portion.

BRIEF DESCRIPTION OF THE DRAWINGS

Embodiments of the inventive concept will be more clearly understood from the following detailed description taken in conjunction with the accompanying drawings in which:

FIGS. 2A and 2B are cross-sectional views illustrating a semiconductor package according to embodiments of the inventive concept, respectively;

DETAILED DESCRIPTION OF THE EMBODIMENTS

Figure 1A:
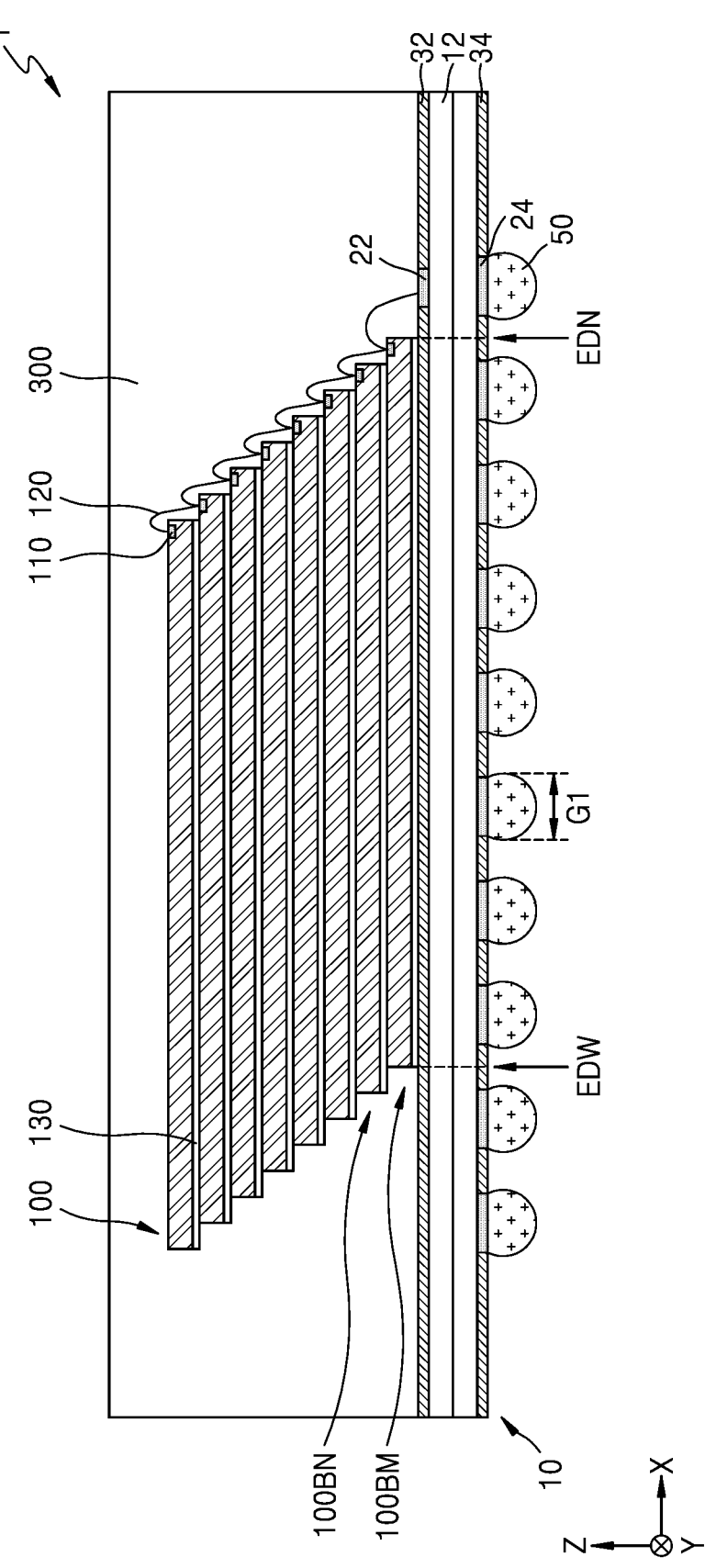
FIGS. 1A and 1B are cross-sectional views illustrating a semiconductor package according to an embodiment of the inventive concept.
Figure 1B:
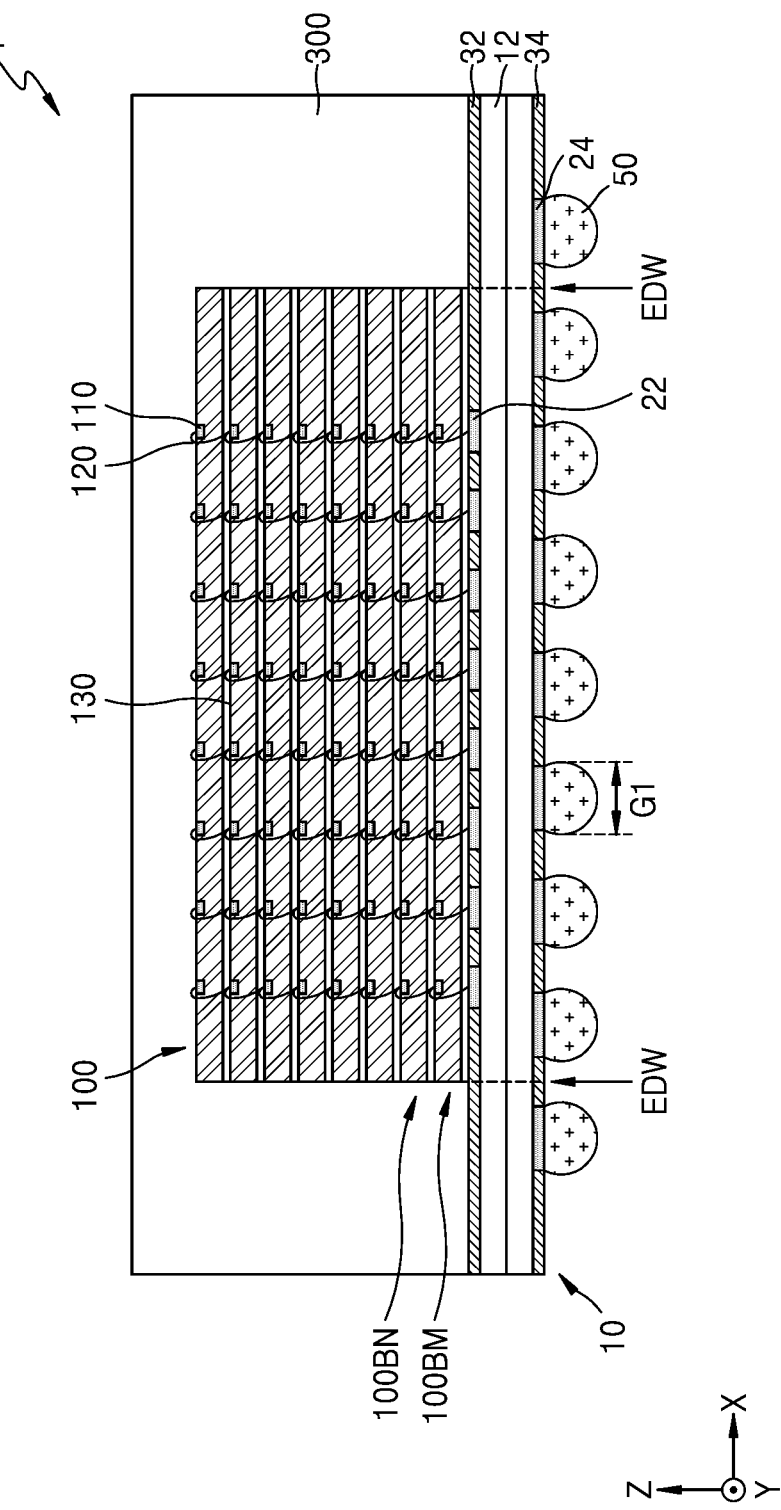
Figure 1C:
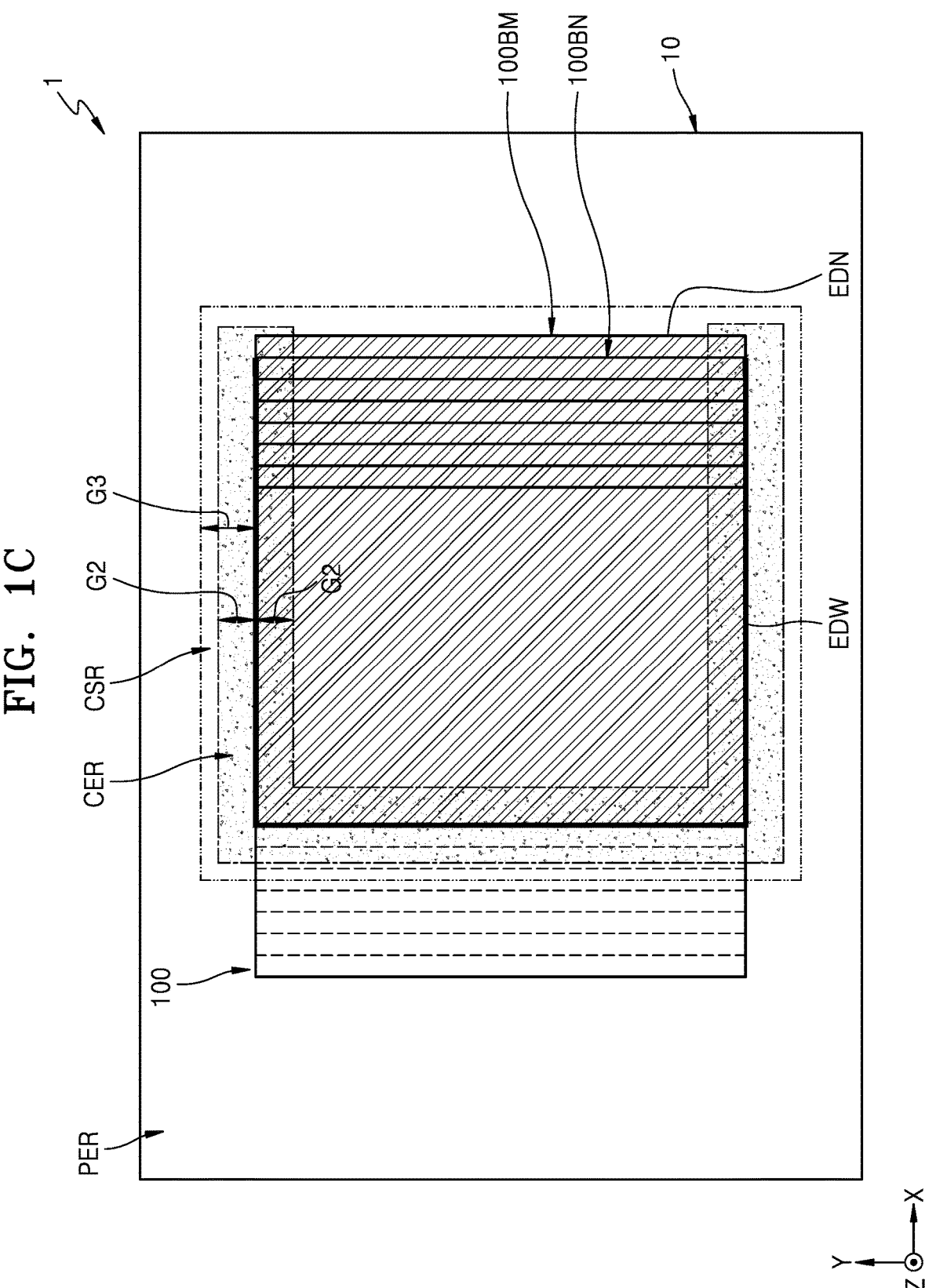
FIG. 1C is a plan layout view of a main portion of the semiconductor package.

FIGS. 1A and 1B are cross-sectional views illustrating a semiconductor package according to an embodiment of the inventive concept, and FIG. 1C is a plan layout view of a main portion of the semiconductor package. In detail, FIG.

1A is a cross-sectional view taken along an X-Z plane, and FIG. 1B is a cross-sectional view taken along a Y-Z plane.

Referring to FIGS. 1A to 1C together, a stacked semiconductor package, that is, a semiconductor package 1, includes a package base substrate 10 and a plurality of semiconductor chips 100.

The package base substrate 10, also described simply as a package substrate, may be, for example, a printed circuit board. For example, the package base substrate 10 may be a double-sided printed circuit board. The package base substrate 10 may include at least one base layer 12, a plurality of upper surface connection pads 22 disposed on an upper surface of at least one base layer 12, and a plurality of lower surface connection pads 24 disposed on a lower surface of at least one base layer 12. In some embodiments, the package base substrate 10 may include a plurality of stacked base layers 12.

For example, the package base substrate 10 may be a multi-layer printed circuit board. When the package base substrate 10 is a multi-layer printed circuit board, wiring layers may be respectively disposed on the lower surface, upper surface, and inside of the package base substrate 10.

In some embodiments, an upper surface solder resist layer 32 and a lower surface solder resist layer 34 may be respectively disposed on the upper and lower surfaces of the package base substrate 10. At least a portion of each of the plurality of upper surface connection pads 22 may be exposed on the upper surface of the package base substrate 10 without being covered by the upper surface solder resist layer 32. At least a portion of each of the plurality of lower surface connection pads 24 may be exposed on the lower surface of the package base substrate 10 without being covered by the lower surface solder resist layer 34. The various pads described herein may have a flat plate shape, having a flat upper surface and a flat lower surface.

In some embodiments, a portion adjacent to the edges of each of the plurality of upper surface connection pads 22 and the plurality of lower surface connection pads 24 is covered by the upper surface solder resist layer 32 and the lower surface solder resist layer 34, and the remaining portions may be exposed without being covered.

The lower surface solder resist layer 34 may have a plurality of openings having a first gap G1, and a portion of the plurality of lower surface connection pads 24 may be exposed through the plurality of openings. The portion of the lower surface connection pad 24 exposed through the opening may be a terminal contact portion CTP of FIGS. 8A to 8E, and the first gap G1 may be twice a first radius RBL shown in FIGS. 8A to 8C. A plurality of external connection terminals 50 may be respectively attached to the plurality of lower surface connection pads 24. The plurality of external connection terminals 50 may be, for example, solder balls or bumps. The plurality of external connection terminals 50 may electrically connect the multilayer semiconductor package, that is, the semiconductor package 1, to an electronic device. The plurality of external connection terminals 50 may be respectively attached to the plurality of lower surface connection pads 24.

In some embodiments, the package base substrate 10 may not include the upper surface solder resist layer 32 and the lower surface solder resist layer 34. In some embodiments, the plurality of upper surface connection pads 22 and the plurality of lower surface connection pads 24 are embedded in at least one base layer 12, and surfaces of the plurality of upper surface connection pads 22 and the plurality of lower surface connection pads 24 may respectively be co-planar with the upper surface and the lower surface of the at least one base layer 12.

In some embodiments, each layer of the at least one base layer 12 may include or be formed of at least one material selected from among phenol resins, epoxy resins, and polyimides. For example, the at least one base layer 12 may include at least one material selected from flame retardant 4 (FR4), tetrafunctional epoxy, and polyphenylene ether, epoxy/polyphenylene oxide, bismaleimide triazine (BT), thermount, cyanate ester, polyimide, and liquid crystal polymer.

An internal wiring pattern (not shown) disposed between the base layers 12 and conductive vias through at least one base layer 12 (not shown) for connecting the plurality of upper surface connection pads 22 to the plurality of lower surface connection pads 24 may be disposed in the package base substrate 10. In some embodiments, an upper surface wiring pattern connected to the plurality of upper surface connection pads 22 may be further disposed on the upper surface of the package base substrate 10. In some embodiments, a lower surface wiring pattern (LP in FIGS. 8A to 8D) connected to the plurality of lower surface connection pads 24 may be further disposed on the lower surface of the package base substrate 10. The lower surface wiring pattern LP may be completely covered by the lower surface solder resist layer 34.

The plurality of upper surface connection pads 22, the plurality of lower surface connection pads 24, the internal wiring pattern, and the upper surface and lower surface wiring patterns may be formed of, for example, electrolytically deposited (ED) copper foil, rolled-annealed (RA) copper foil, stainless steel foil, aluminum foil, ultra-thin copper foils, sputtered copper, copper alloys, or the like. The conductive via may be formed of, for example, copper, nickel, stainless steel, or beryllium copper. The upper surface and lower surface wiring patterns and/or the internal wiring pattern may construct a wiring layer. The upper surface and lower surface wiring patterns and the internal wiring pattern may be collectively referred to as a wiring line. The wiring line may include a signal wiring and a power supply wiring, for example connected to circuits in the semiconductor chips 100 to which power and signals are applied.

The plurality of semiconductor chips 100 may be sequentially stacked on the package base substrate 10 in a vertical direction (Z direction). The plurality of semiconductor chips 100 may be stacked in a step shape to have substantially constant intervals in a horizontal direction (e.g., a –X direction).

The semiconductor chip 100 may comprise a semiconductor substrate. The semiconductor substrate may include or be formed of, for example, silicon (Si, silicon). Alternatively, the semiconductor substrate may include or be formed of a semiconductor element, such as germanium (Ge), or a compound semiconductor, such as silicon carbide (SiC), gallium arsenide (GaAs), indium arsenide (InAs), and indium phosphide (InP). Alternatively, the semiconductor substrate may have a silicon on insulator (SOI) structure. For example, the semiconductor substrate may include a buried oxide layer (BOX). The semiconductor substrate may include a conductive region, for example, a well doped with impurities. The semiconductor substrate may have various device isolation structures, such as a shallow trench isolation (STI) structure. The semiconductor substrate may have an active surface and an inactive surface opposite to the active surface.

In the semiconductor chip 100, an integrated circuit, which may be described as a semiconductor device, including a plurality of individual devices of various types may be formed on the active surface of the semiconductor substrate. The plurality of individual devices may include various microelectronic devices, for example, a metal-oxide-semiconductor field effect transistor (MOSFET), such as a complementary metal-insulator-semiconductor transistor (CMOS), an image sensor, such as a system large scale integration (LSI), a CMOS imaging sensor (CIS), a micro-electro-mechanical system (MEMS), an active device, a passive device, and the like. The plurality of individual devices may be electrically connected to the conductive region of the semiconductor substrate. The integrated circuit may further include at least two of the plurality of individual devices, or a conductive wire or a conductive plug electrically connecting the plurality of individual devices to the conductive region of the semiconductor substrate. In addition, each of the plurality of individual elements may be electrically isolated from the other neighboring individual element by an insulating layer.

Each semiconductor chip 100 may be, for example, a memory semiconductor chip. The memory semiconductor chip may be, for example, a non-volatile memory semiconductor chip, such as flash memory, phase-change random access memory (PRAM), magnetoresistive random access memory (MRAM), ferroelectric random access memory (FeRAM), resistive random access memory (RRAM), or the like. The flash memory may be, for example, V-NAND flash memory. In some embodiments, the semiconductor chip 100 may be a volatile memory semiconductor chip, such as dynamic random access memory (DRAM) or static random access memory (SRAM).

Each of the plurality of semiconductor chips 100 may include a plurality of chip pads 110 disposed on the active surface. Each of the plurality of semiconductor chips 100 may be stacked on the package base substrate 10 such that the active surface thereof faces upward, that is, in a direction opposite to the package base substrate 10. A plurality of bonding wires 120 may be attached between the plurality of chip pads 110 and the plurality of upper surface connection pads 22. Each semiconductor chip 100 may be electrically connected to the package base substrate 10 through the plurality of bonding wires 120.

In some embodiments, the plurality of bonding wires 120 may be sequentially connected with the plurality of chip pads 110 of each of the plurality of semiconductor chips 100 from the plurality of chip pads 110 of the uppermost semiconductor chip 100 to the plurality of chip pads 110 of the lowermost semiconductor chip 100 and then connected to the plurality of upper surface connection pads 22. In some embodiments, the plurality of bonding wires 120 may connect between the plurality of chip pads 110 of each of the plurality of semiconductor chips 100 and the plurality of upper surface connection pads 22, respectively.

The plurality of semiconductor chips 100 may have a die adhesive film 130 attached to a lower surface thereof between the plurality of semiconductor chips 100 and may be attached to a structure under the plurality of semiconductor chips 100. For example, the lowermost semiconductor chip 100 among the plurality of semiconductor chips 100 may be attached on the package base substrate 10 with the die adhesive film 130 therebetween, and the remaining semiconductor chips 100 have the die adhesive film 130 therebetween, and each of the remaining semiconductor chips 100 may be attached to another semiconductor chip 100 thereunder.

The die adhesive film 130 may include or may be, for example, an inorganic adhesive or a polymer adhesive. The polymer adhesive may include, for example, a thermosetting resin or a thermoplastic resin. The thermosetting polymer has a three-dimensional cross-link structure after the monomer is heat-molded and does not soften even when reheated. On the other hand, in the case of the thermoplastic polymer, the thermoplastic polymer is a polymer that exhibits plasticity by heating and has a structure of a linear polymer. In addition, the polymer adhesive may be of a hybrid type made by mixing these two components.

In some embodiments, a controller chip may be further included on the package base substrate 10 (e.g., adjacent to the package base substrate 10) or on the uppermost semiconductor chip 100 among the plurality of semiconductor chips 100 (e.g., adjacent to and above the uppermost semiconductor chip 100). It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Other words used to describe the relationship between elements should be interpreted in a like fashion (e.g., "between" versus "directly between," "adjacent" versus "directly adjacent," etc.).

A controller may be built in the controller chip. The controller may control access to data stored in the plurality of semiconductor chips 100. For example, the controller may control write/read operations of the plurality of semiconductor chips 100, for example, flash memory, based on a control command from an external host. In some embodiments, the controller may be configured as a separate control semiconductor chip, such as an application specific integrated circuit (ASIC). The controller may perform wear leveling, garbage collection, bad block management, and error correction code (ECC) on the nonvolatile memory semiconductor chip.

A mold layer 300 may be disposed on the package base substrate 10 to cover the upper surface of the package base substrate 10 and surround the plurality of semiconductor chips 100 and the plurality of bonding wires 120. The mold layer 300 may be, for example, an epoxy molding compound (EMC).

The plurality of semiconductor chips 100 include a first semiconductor chip 100BM that is lowermost and a second semiconductor chip 100BN that is the second lowermost and is stacked on the first semiconductor chip 100BM. On a plane (XY plane) of the plurality of semiconductor chips 100, an edge of the first semiconductor chip 100BM that is the lowermost may include a first edge EDW and a second edge EDN. The first edge EDW is a portion overlapping the second semiconductor chip 100BN in the vertical direction (Z direction) among the edges of the first semiconductor chip 100BM, and the second edge EDN is a portion of the edge of the first semiconductor chip 100BM that does not overlap the second semiconductor chip 100BN on an upper side thereof in the vertical direction (Z direction). For example, an edge or an inner portion of the second semiconductor chip 100BN is disposed on the first edge EDW of the first semiconductor chip 100BM, and an edge or an inner portion of the second semiconductor chip 100BN is not disposed on the second edge EDN of the first semiconductor chip 100BM. In FIG. 1C, for convenience of classification, the first edge EDW is illustrated by a thick solid line, and the second edge EDN is illustrated by a thin solid line.

For example, among the four edges of the first semiconductor chip 100BM, all of one edge and a portion of the other two edges are the first edge EDW, and the remainder of the other two edges and all of the other edge may be the second edge EDN.

The first edge EDW may be referred to as an overlapping chip edge, and the second edge EDN may be referred to as a non-overlapping chip edge.

The portion from the portion of the package base substrate 10 overlapping the first edge EDW in the vertical direction (Z direction) extending a distance of a second gap G2 in opposite directions of the planar direction (XY direction) may be described as an overlapping chip edge region CER. For example, the width of the overlapping chip edge region CER may be twice the second gap G2. For example, the second gap G2 may have a value equal to or greater than the first gap G1. For example, the second gap G2 may be 1 to 2 times the first gap G1. In some embodiments, the second gap G2 may have the same value as the first gap G1. In some other embodiments, the second gap G2 may have a value twice that of the first gap G1. For example, the width of the overlapping chip edge region CER may be 2 to 4 times the width of the first gap G1.

The portion from the portion of the package base substrate 10 overlapping the first semiconductor chip 100BM of the lowermost in the vertical direction (Z direction) extending a distance of a third gap G3 in the planar direction (XY direction) may be described as a chip attach region CSR. In FIG. 1C, the third gap G3 is shown to be larger than the second gap G2, but is not limited thereto, and the third gap G3 may have a value equal to or greater than the second gap G2. For example, the third gap G3 may be 1 to 2 times the second gap G2. In some embodiments, the third gap G3 may have the same value as the second gap G2. In some other embodiments, the third gap G3 may have a value twice that of the second gap G2. The overlapping chip edge region CER may be included in the chip attach region CSR. In the present specification, when the difference between the overlapping chip edge region CER and the chip attach region CSR is separately described, the chip attach region CSR may mean a portion excluding the overlapping chip edge region CER, and when the chip attach region CSR is described without specific reference to the overlapping chip edge region CER, the chip attach region CSR may mean including the overlapping chip edge region CER.

A portion of the package substrate 10 excluding the overlapping chip edge region CER and the chip attach region CSR may be referred to as a peripheral region PER. Although it will be described with reference to FIGS. 8A to 9P, some of the lower surface connection pads 24 disposed in each of the overlapping chip edge region CER, the chip attach region CSR, and the peripheral region PER may have different planar shapes. The peripheral region PER may surround the chip attach region CSR.

Figure 2A:
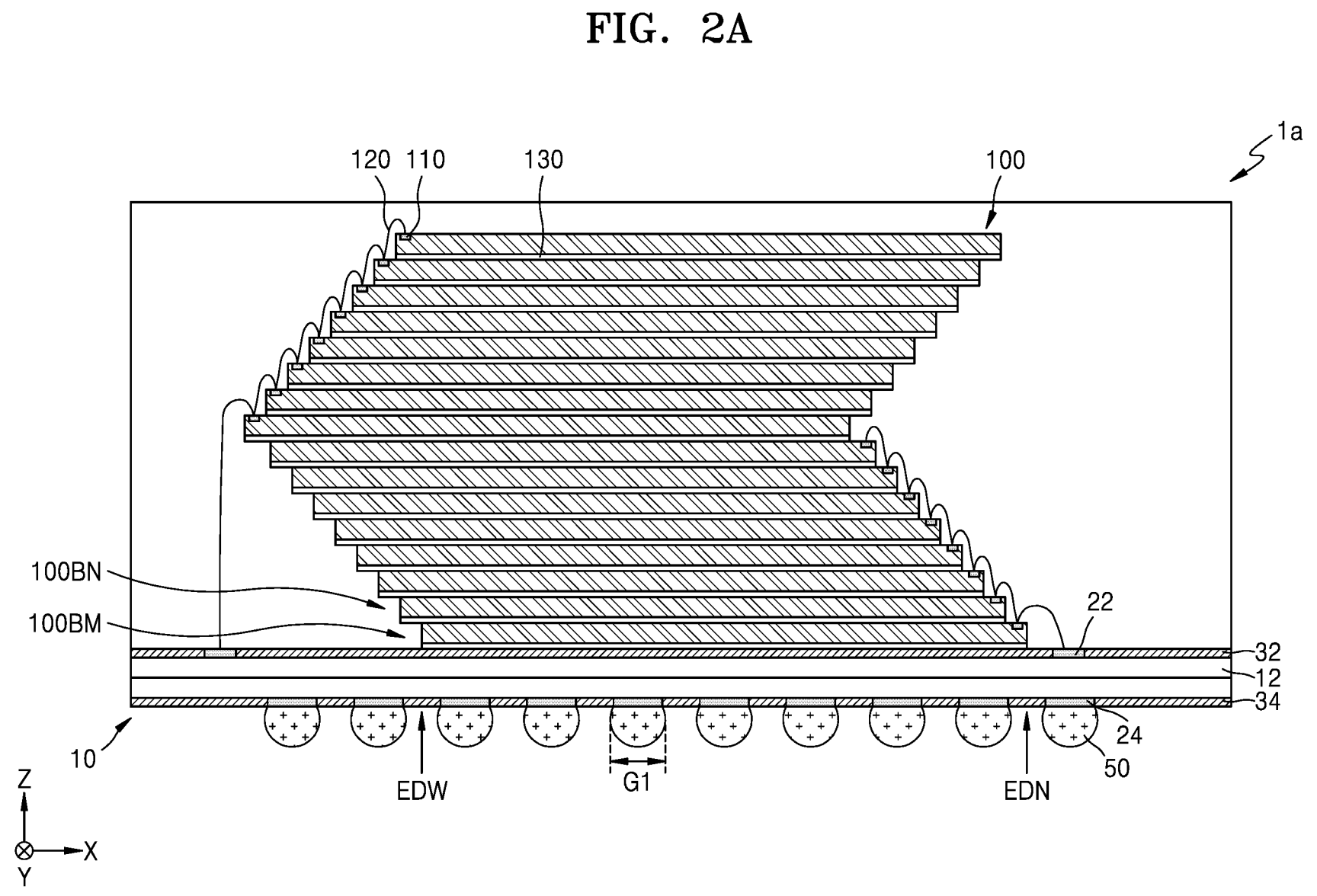
Figure 2B:
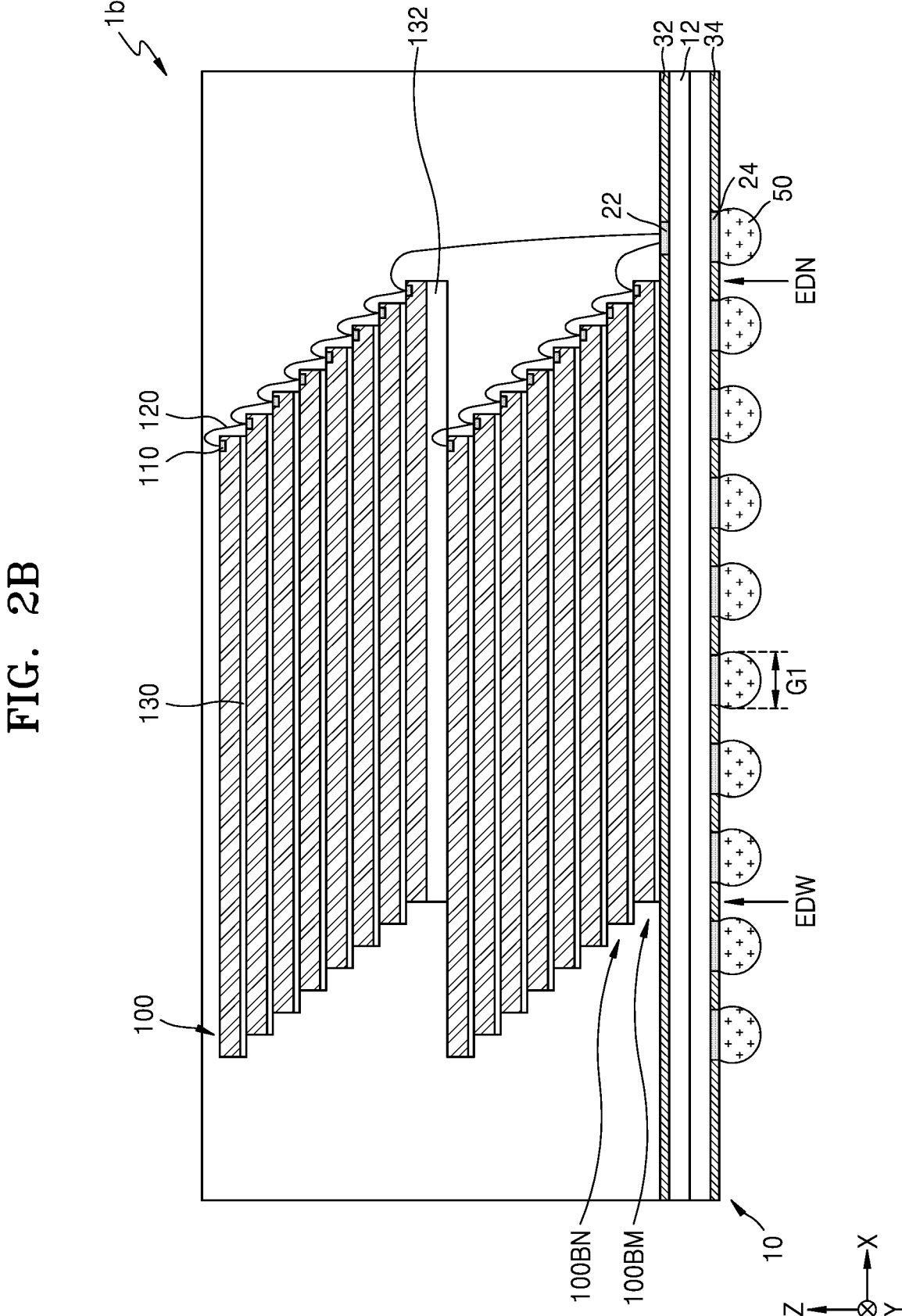

FIGS. 2A and 2B are cross-sectional views illustrating a semiconductor package according to an embodiment of the inventive concept, respectively. In the description of FIGS. 2A and 2B, the descriptions already given with reference to FIGS. 1A to 1C may be omitted.

Referring to FIG. 2A, a stacked semiconductor package 1a includes a package base substrate 10 and a plurality of semiconductor chips 100.

The plurality of semiconductor chips 100 may be sequentially stacked on the package base substrate 10 in a vertical direction (Z direction). The plurality of semiconductor chips 100 may be stacked in a step shape to have substantially constant intervals in a horizontal direction (e.g., an X direction and a –X direction, wherein both the X and –X direction refer to a first direction—e.g., a first horizontal direction—but the X direction is a direction toward a first edge of the semiconductor package and the –X direction is a direction away from the first edge of the semiconductor package). In detail, the stacked semiconductor package 1a may be stacked on the package base substrate 10 in a step shape such that some of the plurality of semiconductor chips 100 have substantially constant intervals toward a first edge of the semiconductor package in the –X direction, and then on the upper side thereof, the other semiconductor chips 100 may be stacked on the package base substrate 10 in a step shape to have a substantially constant interval away from the first edge of the semiconductor package in the X direction.

Although not shown separately, the plurality of semiconductor chips 100 may be alternately stacked two or more times in a step shape on the package base substrate 10 so that some different ones of the plurality of semiconductor chips 100 have substantially constant intervals in the –X direction and the X direction, respectively (e.g., toward and away from the first edge of the semiconductor package).

Referring to FIG. 2B, a stacked semiconductor package 1b includes a package base substrate 10 and a plurality of semiconductor chips 100.

The plurality of semiconductor chips 100 may be sequentially stacked on the package base substrate 10 in a vertical direction (Z direction). The plurality of semiconductor chips 100 may be stacked in a step shape to have substantially constant intervals in a horizontal direction (e.g., –X direction) toward a first edge of the semiconductor package. In detail, the stacked semiconductor package 1b is stacked on the package base substrate 10 in a step shape such that a first group of semiconductor chips 100 of the plurality of semiconductor chips 100 have substantially constant intervals in the –X direction toward a first edge of the semiconductor package, and then on the upper side thereof, a second group including the other semiconductor chips of the plurality of semiconductor chips 100 may be stacked in a step shape to have a substantially constant interval in the –X direction toward the first edge of the semiconductor package so as to overhang on the first group of the plurality of semiconductor chips 100.

In some embodiments, a thick die adhesive film 132 may be disposed between the first group of the plurality of semiconductor chips 100 and the semiconductor chip 100 of the lowermost among the second group of the semiconductor chips 100 stacked on the first group of the plurality of semiconductor chips 100. The thickness of the thick die adhesive film 132 may be greater than the thickness of the die adhesive film 130.

Although not shown separately, the plurality of semiconductor chips 100 may be alternately stacked three or more times in a step shape on the package base substrate 10 so that different ones have substantially constant intervals in the –X direction, respectively.

A plan layout view of main portions of the stacked semiconductor packages 1a and 1b shown in FIGS. 2A and 2B, respectively, that is, the package base substrate 10 of the stacked semiconductor packages 1a and 1b and some of the lower portion of the plurality of semiconductor chips 100, is substantially the same as that of FIG. 1C, and thus a separate illustration is omitted.

In detail, the plurality of semiconductor chips 100 included in the stacked semiconductor packages 1a and 1b shown in FIGS. 2A and 2B, respectively, include a first semiconductor chip 100BM that is the lowermost and a second semiconductor chip 100BN that is the second lowermost and is stacked on the first semiconductor chip 100BM. Even when a change occurs in the step shape in which some of the upper portions of the plurality of semiconductor chips 100 are stacked, the first edge EDW and the second edge EDN of the first semiconductor chip 100BM of the lowermost among the plurality of semiconductor chips 100 have the same shape in which the second semiconductor chip 100BN is stacked on the first semiconductor chip 100BM. Therefore, as shown in FIG. 1C, among the four edges of the first semiconductor chip 100BM, all of one edge and a portion of the other two edges may be the first edge EDW, and the remaining portions of the other two edges and all of the other one edge may be the second edge EDN.

Accordingly, the overlapping chip edge region CER shown in FIG. 1C may be determined by the stacking shape of the first semiconductor chip 100BM that is the lowermost and the second semiconductor chip 100BN that is the second lowermost among the plurality of semiconductor chips 100, and the stacking shape of the other semiconductor chips 100 stacked thereon may not affect the determination of the overlapping chip edge region CER.

Figure 3A:
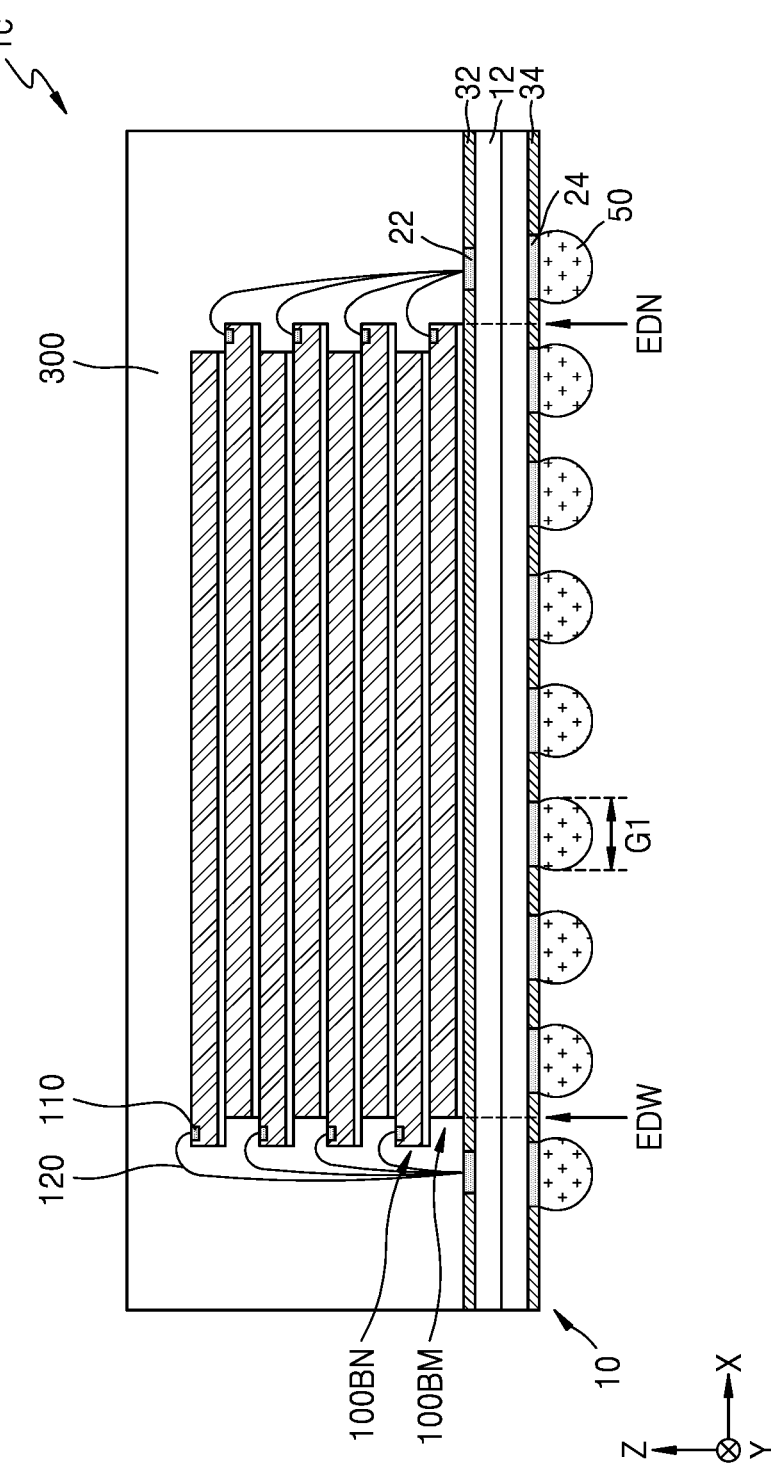
FIG. 3A is a cross-sectional view illustrating a semiconductor package according to an embodiment of the inventive concept.
Figure 3B:
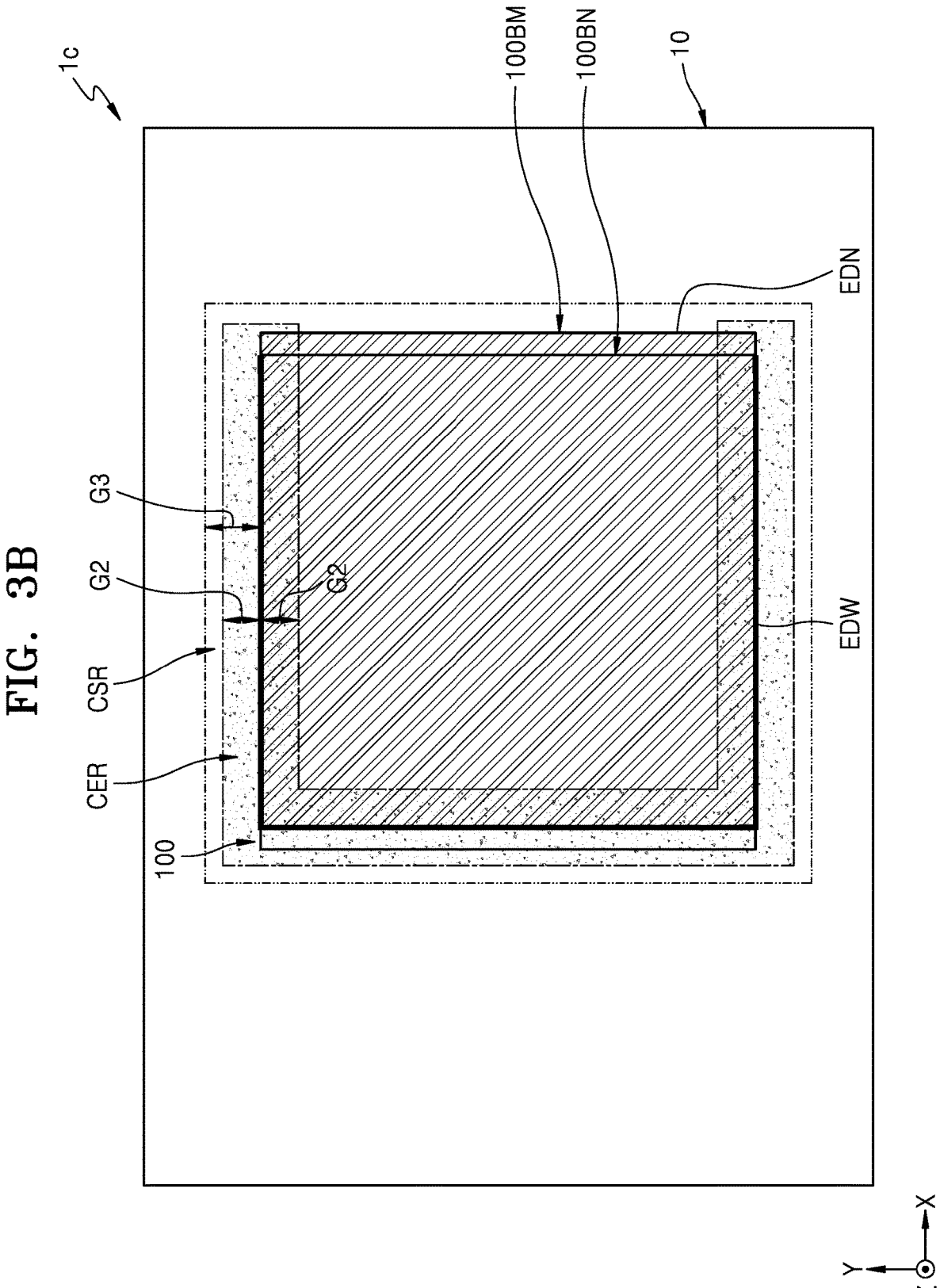
FIG. 3B is a plan layout view of a main portion of the semiconductor package.

FIG. 3A is a cross-sectional view illustrating a semiconductor package according to an embodiment of the inventive concept, and FIG. 3B is a plan layout view of a main portion of the semiconductor package. In the description of FIGS. 3A and 3B, the descriptions already given with reference to FIGS. 1A to 2B may be omitted.

Referring to FIGS. 3A and 3B together, a stacked semiconductor package 1c includes a package base substrate 10 and a plurality of semiconductor chips 100. The plurality of semiconductor chips 100 may be sequentially stacked on the package base substrate 10 in a vertical direction (Z direction). The plurality of semiconductor chips 100 may be alternately shifted and stacked to have substantially constant intervals in a horizontal direction (e.g., an X direction and a –X direction). In detail, in the stacked semiconductor package 1c, the plurality of semiconductor chips 100 may be stacked on the package base substrate 10 in the –X direction and the X direction alternately (e.g., in a zig-zag manner) at substantially constant intervals and may be stacked in a vertical direction (Z direction).

The plurality of semiconductor chips 100 include a first semiconductor chip 100BM that is the lowermost and a second semiconductor chip 100BN that is the second lowermost and is stacked on the first semiconductor chip 100BM. On a plane (XY plane) of the plurality of semiconductor chips 100, an edge of the first semiconductor chip 100BM of the lowermost may include a first edge EDW and a second edge EDN. The first edge EDW is a portion overlapping the second semiconductor chip 100BN in the vertical direction (Z direction) among the edges of the first semiconductor chip 100BM, and the second edge EDN is a portion of the edge of the first semiconductor chip 100BM that does not overlap the second semiconductor chip 100BN on an upper side thereof in the vertical direction (Z direction). That is, an edge or an inner portion of the second semiconductor chip 100BN is disposed on the first edge EDW of the first semiconductor chip 100BM, and an edge or an inner portion of the second semiconductor chip 100BN is not disposed on the second edge EDN of the first semiconductor chip 100BM.

For example, among the four edges of the first semiconductor chip 100BM, all of one edge and a portion of the other two edges are the first edge EDW, and the remainder of the other two edges and all of the other edge may be the second edge EDN.

The portion from the portion of the package base substrate 10 overlapping the first edge EDW in the vertical direction (Z direction) extending a distance of a second gap G2 in opposite directions in the planar direction (XY direction) may be described as an overlapping chip edge region CER. For example, the second gap G2 may have a value (e.g., distance) equal to or greater than the first gap G1. In some embodiments, the second gap G2 may have the same value as the first gap G1. In some other embodiments, the second gap G2 may have a value twice that of the first gap G1.

The portion from the portion of the package base substrate 10 overlapping the first semiconductor chip 100BM of the lowermost in the vertical direction (Z direction) extending a distance of a third gap G3 in the planar direction (XY direction) may be described as a chip attach region CSR.

Figure 4A:
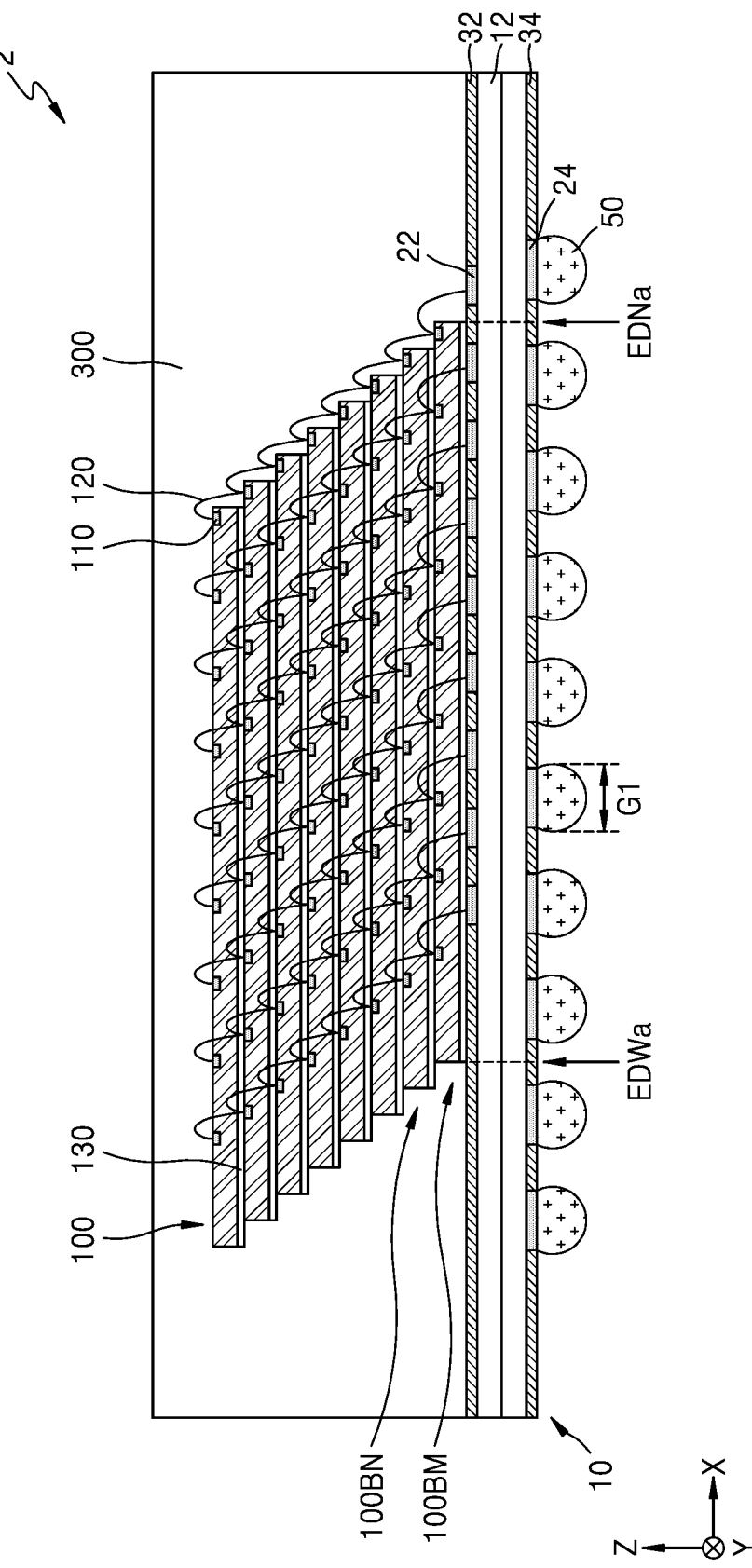
FIG. 4A is a cross-sectional view illustrating a semiconductor package according to an embodiment of the inventive concept.
Figure 4B:
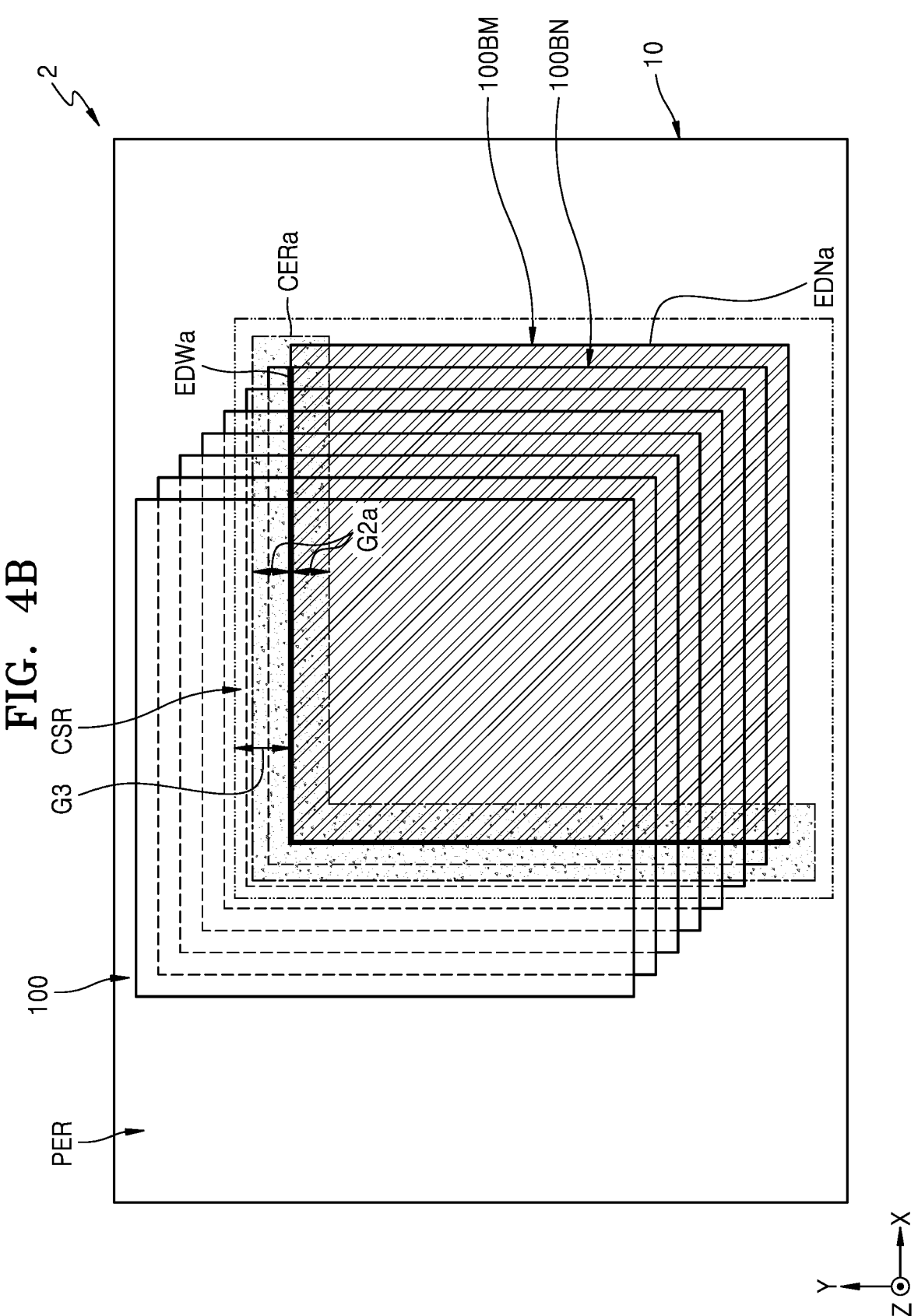
FIG. 4B is a plan layout view of a main portion of the semiconductor package.

FIG. 4A is a cross-sectional view illustrating a semiconductor package according to an embodiment of the inventive concept, and FIG. 4B is a plan layout view of a main portion of the semiconductor package. In the description of FIGS. 4A and 4B, the descriptions already given with reference to FIGS. 1A to 3B may be omitted.

Referring to FIGS. 4A and 4B together, a stacked semiconductor package 2 includes a package base substrate 10 and a plurality of semiconductor chips 100. The plurality of semiconductor chips 100 may be sequentially stacked on the package base substrate 10 in a vertical direction (Z direction). The plurality of semiconductor chips 100 may be stacked in a step shape to have substantially constant intervals in a horizontal direction (e.g., an XY direction). In detail, the stacked semiconductor package 2 may be stacked on the package base substrate 10 in a vertical direction (Z direction) in a step shape to have substantially constant intervals in each of the –X direction and the –Y direction in an oblique direction with respect to the edge of each of the plurality of semiconductor chips 100.

The plurality of semiconductor chips 100 include a first semiconductor chip 100BM that is the lowermost and a second semiconductor chip 100BN that is the second lowermost and is stacked on the first semiconductor chip 100BM. On a plane (XY plane) of the plurality of semiconductor chips 100, an edge of the first semiconductor chip 100BM of the lowermost may include a first edge EDWa and a second edge EDNa. The first edge EDWa is a portion overlapping the second semiconductor chip 100BN in the vertical direction (Z direction) among the edges of the first semiconductor chip 100BM, and the second edge EDNa is a portion of the edge of the first semiconductor chip 100BM that does not overlap the second semiconductor chip 100BN on an upper side thereof in the vertical direction (Z direction). That is, an edge or an inner portion of the second semiconductor chip 100BN is disposed on the first edge EDWa of the first semiconductor chip 100BM, and an edge or an inner portion of the second semiconductor chip 100BN is not disposed on the second edge EDNa of the first semiconductor chip 100BM.

For example, among the four edges of the first semiconductor chip 100BM, a portion of the two edges may be the first edge EDWa, and the remaining portions of the two edges and all of the other two edges may be the second edge EDNa.

A portion from the portion of the package base substrate 10 overlapping the first edge EDWa in the vertical direction (Z direction) extending a distance of a second gap G2a in the planar direction (XY direction) may be described as an overlapping chip edge region CERa. For example, the second gap G2a may have a value equal to or greater than a first gap G1. In some embodiments, the second gap G2a may have the same value as the first gap G1. In some other embodiments, the second gap G2a may have a value twice that of the first gap G1.

The portion from the portion of the package base substrate 10 overlapping the first semiconductor chip 100BM of the lowermost in the vertical direction (Z direction) extending a distance of a third gap G3 in the planar direction (XY direction) may be described as a chip attach region CSR.

Figure 5A:
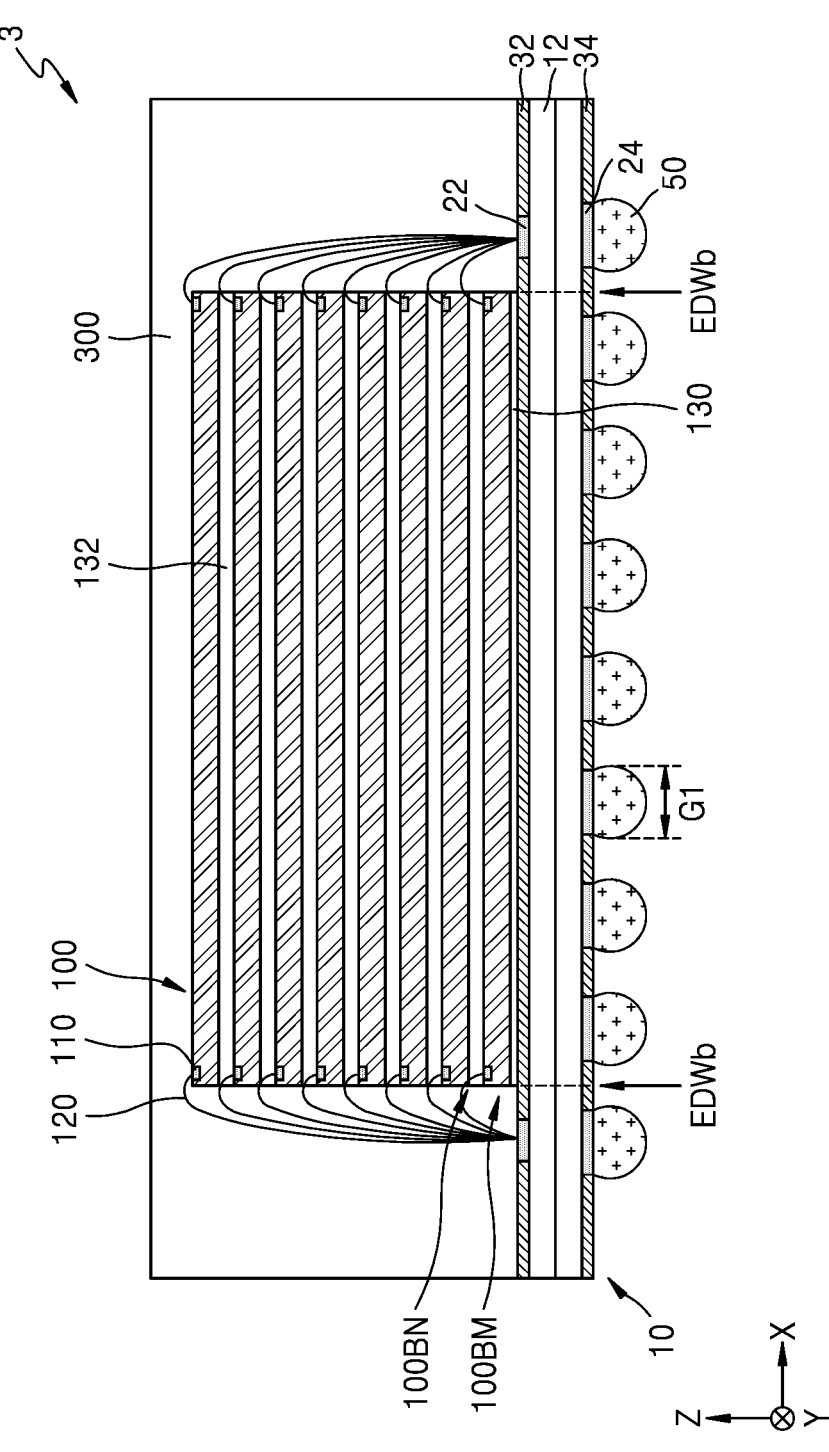
FIGS. 5A and 5B are cross-sectional views illustrating a semiconductor package according to embodiments of the inventive concept.
Figure 5B:
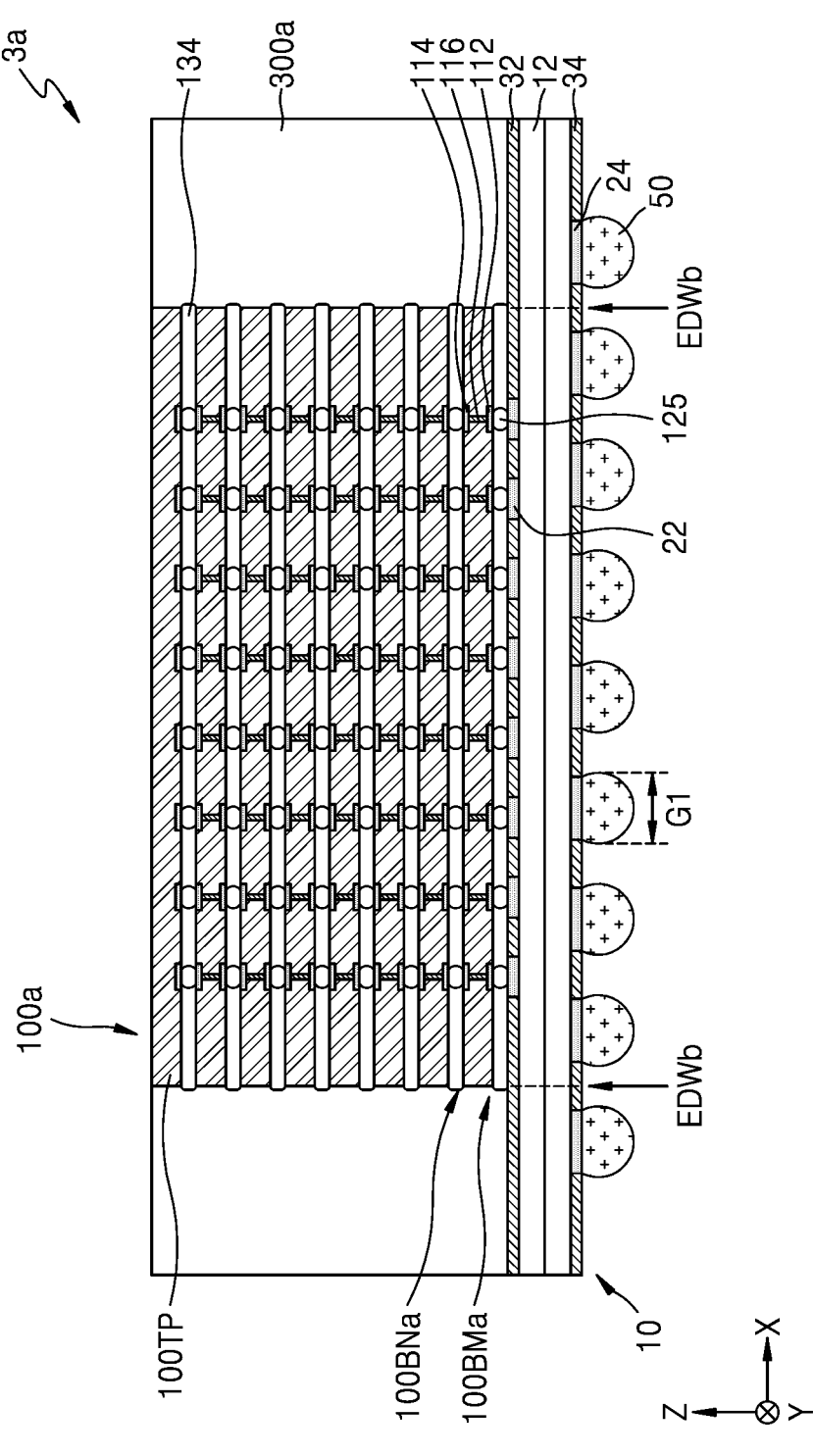
Figure 5C:
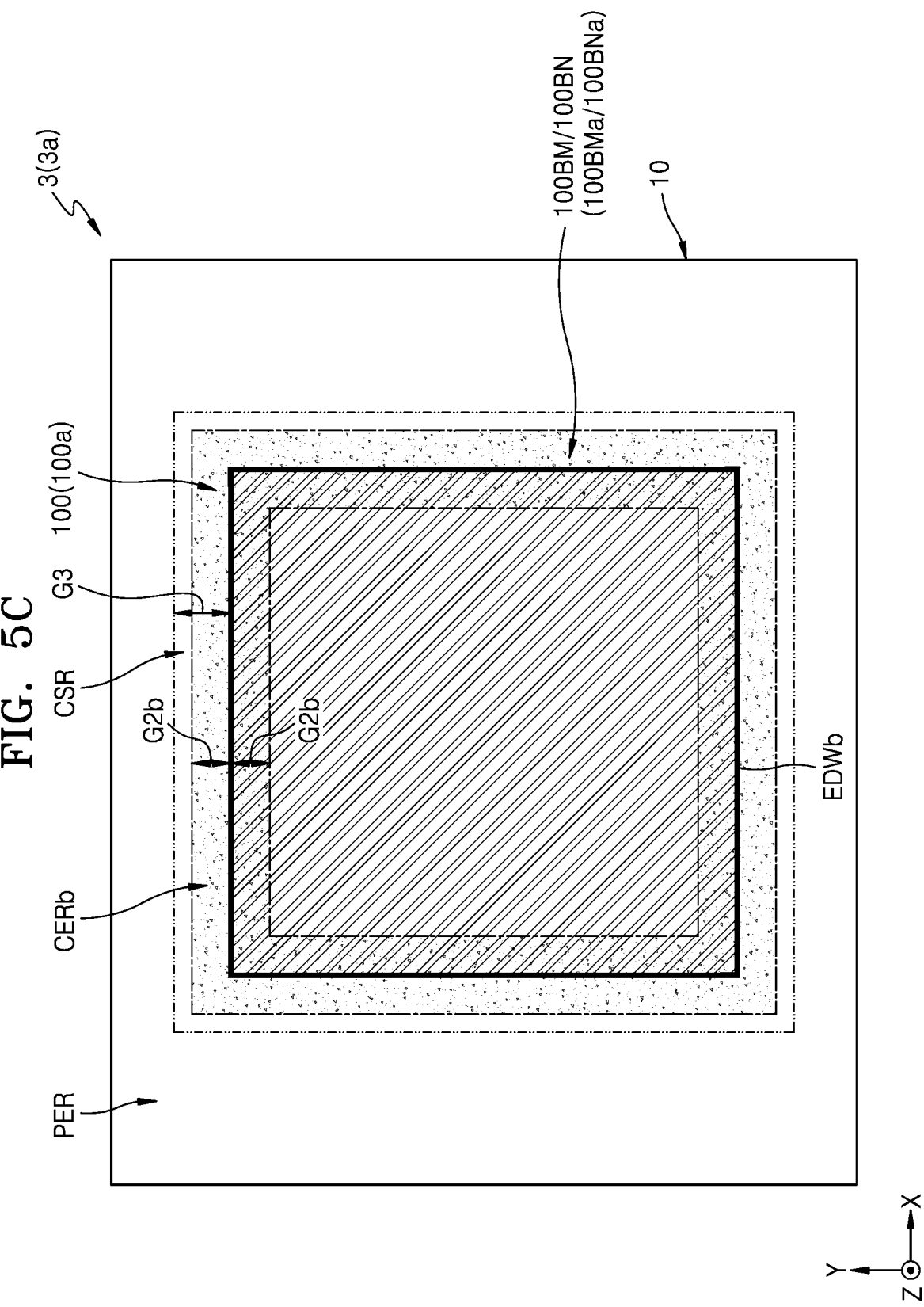
FIG. 5C is a plan layout view of a main portion of the semiconductor package.

FIGS. 5A and 5B are cross-sectional views illustrating a semiconductor package according to an embodiment of the inventive concept, and FIG. 5C is a plan layout view of a main portion of the semiconductor package. In the description of FIGS. 5A and 5C, the descriptions already given with reference to FIGS. 1A to 4B may be omitted.

Referring to FIG. 5 together, a stacked semiconductor package 3 includes a package base substrate 10 and a plurality of semiconductor chips 100. The plurality of semiconductor chips 100 may be sequentially stacked on the package base substrate 10 in a vertical direction (Z direction). The plurality of semiconductor chips 100 may be stacked to fully overlap each other in the vertical direction (Z direction).

The plurality of semiconductor chips 100 may have a thick die adhesive film 132 attached to a lower surface thereof therebetween, and may be attached to a structure under the semiconductor chip 100. For example, the semiconductor chip 100 has the thick die adhesive film 132 thereunder, and may be attached to another semiconductor chip 100 under the semiconductor chip 100. In some embodiments, the semiconductor chip 100 that is lowermost among the plurality of semiconductor chips 100 may be attached on the package base substrate 10 with the die adhesive film 130 therebetween. The thickness of the thick die adhesive film 132 may be greater than the thickness of the die adhesive film 130.

The thick die adhesive film 132 of one semiconductor chip 100 may cover the plurality of chip pads 110 of the lower semiconductor chip 100 therebelow. A portion of the plurality of bonding wires 120 connected to the plurality of chip pads 110 may be embedded in the thick die adhesive film 132.

Referring to FIG. 5B, a stacked semiconductor package 3a includes a package base substrate 10 and a plurality of semiconductor chips 100a. The plurality of semiconductor chips 100a may be sequentially stacked on the package base substrate 10 in a vertical direction (Z direction). The plurality of semiconductor chips 100a may be stacked to overlap each other in the vertical direction (Z direction).

Each of the plurality of semiconductor chips 100a may include a plurality of chip pads 112 disposed on an active surface and a plurality of rear pads 114 disposed on an inactive surface. Each of the plurality of semiconductor chips 100a may include a plurality of through electrodes 116 connecting the plurality of chip pads 112 and the plurality of rear pads 114 to each other. In some embodiments, an uppermost semiconductor chip 100TP among the plurality of semiconductor chips 100a may not include the plurality of rear pads 114 and the plurality of through electrodes 116.

Each of the plurality of semiconductor chips 100a may be stacked on the package base substrate 10 such that the active surface thereof faces downward, that is, the package base substrate 10. A plurality of chip connection terminals 125 may be attached to the plurality of chip pads 112 of each of the plurality of semiconductor chips 100a. The plurality of chip connection terminals 125 may electrically connect between the plurality of chip pads 112 and the plurality of upper surface connection pads 22, and may electrically connect between the plurality of chip pads 112 and the plurality of rear pads 114 of the lower semiconductor chip 100*a*.

A filling layer 134 surrounding the plurality of chip connection terminals 125 may be disposed between the first semiconductor chip 100BMa of the lowermost among the plurality of semiconductor chips 100*a* and the package base substrate 10 and between the plurality of semiconductor chips 100*a*. The filling layer 134 may include, for example, a die attach film (DAF), a non-conductive film (NCF), an anisotropic conductive film (ACF), an instant adhesive, a thermosetting adhesive, a laser curing adhesive, an ultrasonic curing adhesive, a non-conductive paste (NCP), or the like.

In some embodiments, the filling layer 134 may convexly protrude outward from the edges of the plurality of semiconductor chips 100*a*. In some other embodiments, the filling layer 134 may protrude outward from the edges of the plurality of semiconductor chips 100*a* to cover at least a portion of a side surface of each of the plurality of semiconductor chips 100*a*.

A mold layer 300*a* covering the top surface of the package base substrate 10 and surrounding the plurality of semiconductor chips 100*a* may be disposed on the package base substrate 10. In some embodiments, the mold layer 300*a* may expose without covering the upper surface of the uppermost semiconductor chip 100TP. In some embodiments, a heat dissipation member may be attached to the upper surface of the uppermost semiconductor chip 100TP. A thermally conductive interface material (TIM) layer may be disposed between the upper surface of the uppermost semiconductor chip 100TP and the heat dissipation member.

Referring to FIGS. 5A to 5C together, the plurality of semiconductor chips 100 included in the stacked semiconductor package 3 or the plurality of semiconductor chips 100*a* included in the stacked semiconductor package 3*a* include the first semiconductor chips 100BM or 100BMa that is the lowermost and the second semiconductor chips 100BN or 100BNa that is the second lowermost and is stacked on the semiconductor chip 100BM or 100BMa The four edges EDWb included in the edges of the first semiconductor chips 100BM and 100BMa of the lowermost may all overlap the second semiconductor chips 100BN and 100BNa in the vertical direction (Z direction). All edges or inner portions of the second semiconductor chips 100BN and 100BNa may be disposed on the edges EDWb of the first semiconductor chip 100BM and 100BMa.

A portion from the portion of the package base substrate 10 overlapping the four edges EDWb included in the edges of the first semiconductor chips 100BM and 100BMa in the vertical direction (Z direction) extending a distance of a second gap G2*b* in opposite directions in the planar direction (XY direction) may be described as an overlapping chip edge region CERb. For example, the second gap G2*b* may have a value equal to or greater than a first gap G1. In some embodiments, the second gap G2*b* may have the same value as the first gap G1. In some other embodiments, the second gap G2*b* may have a value twice that of the first gap G1.

The portion from the portion of the package base substrate 10 overlapping the first semiconductor chip 100BM of the lowermost in the vertical direction (Z direction) extending a distance of a third gap G3 in the planar direction (XY direction) may be a chip attach region CSR.

Figure 6A:
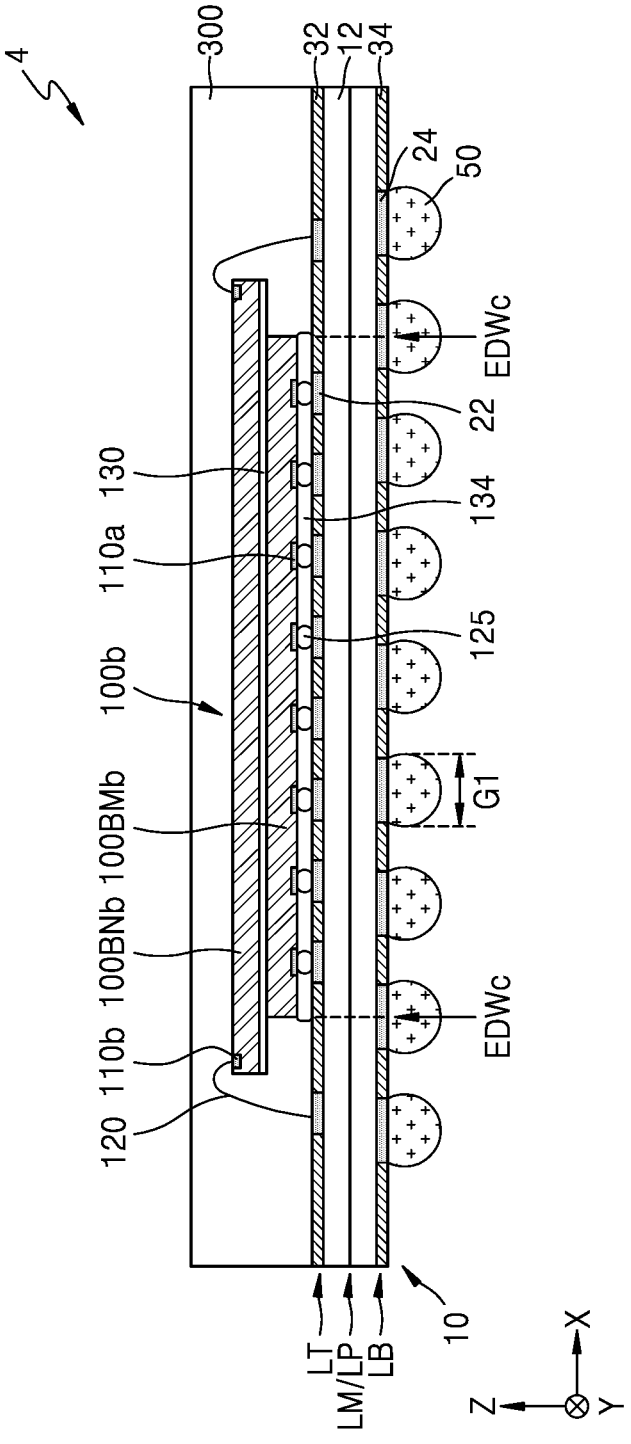
FIG. 6A is a cross-sectional view illustrating a semiconductor package according to an embodiment of the inventive concept.
Figure 6B:
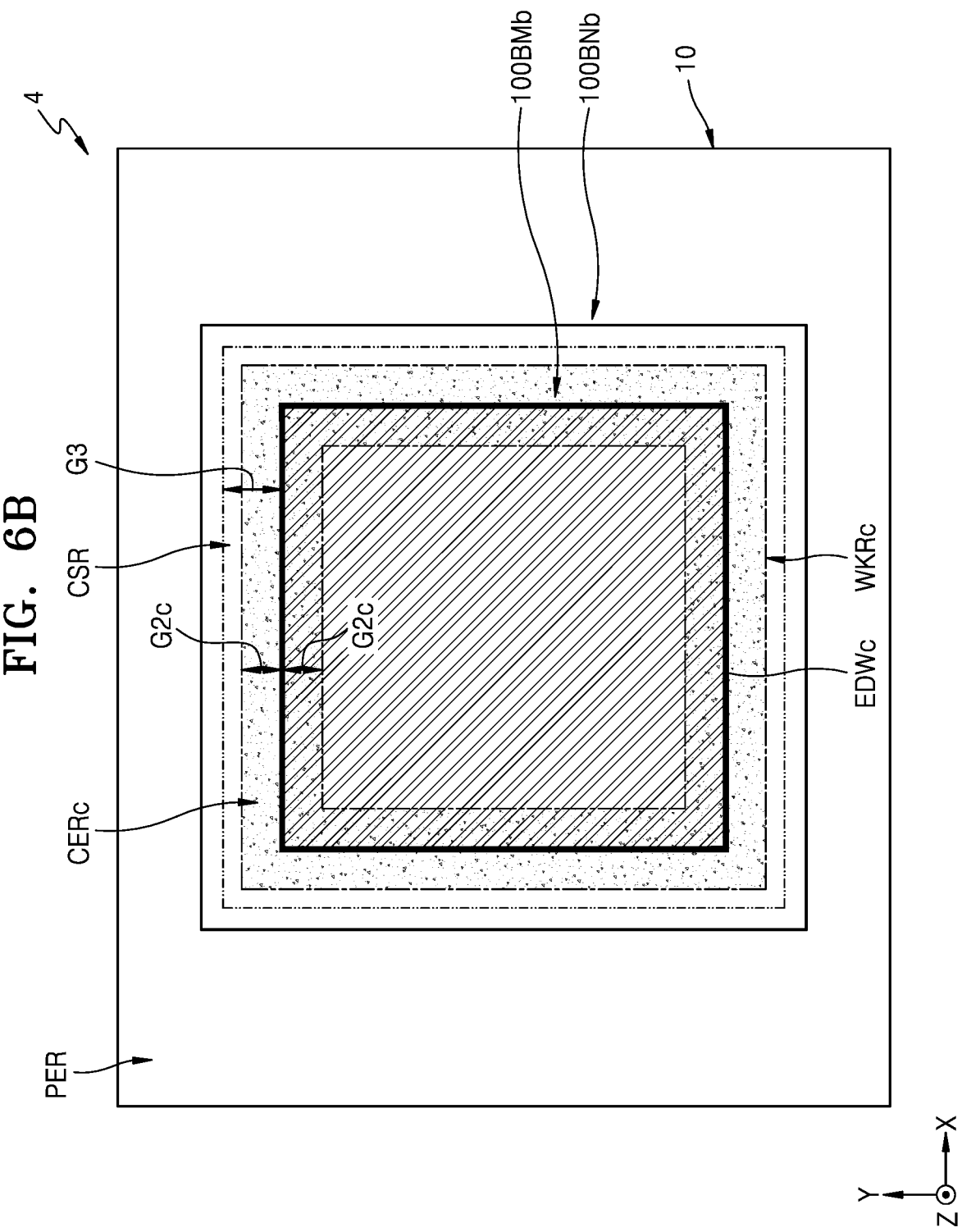
FIG. 6B is a plan layout view of a main portion of the semiconductor package.

FIG. 6A is a cross-sectional view illustrating a semiconductor package according to an embodiment of the inventive concept, and FIG. 6B is a plan layout view of a main portion of the semiconductor package. In the description of FIGS. 6A and 6B, the descriptions already given with reference to FIGS. 1A to 5C may be omitted.

Referring to FIGS. 6A and 6B together, a stacked semiconductor package 4 includes a package base substrate 10 and a plurality of semiconductor chips 100*b*. The plurality of semiconductor chips 100*b* may be sequentially stacked on the package base substrate 10 in a vertical direction (Z direction). The plurality of semiconductor chips 100*b* may include a first semiconductor chip 100BMb and a second semiconductor chip 100BNb stacked on the first semiconductor chip 100BMb. The horizontal width in the X direction and horizontal width in the Y direction of the second semiconductor chip 100BNb may be greater than the respective horizontal widths of the first semiconductor chip 100BMb. The first semiconductor chip 100BMb may entirely overlap the second semiconductor chip 100BNb in the vertical direction, and the second semiconductor chip 100BNb may extend to the outside of the first semiconductor chip 100BMb in a horizontal direction and may overhang in a horizontal direction (X direction and/or Y direction) with respect to the first semiconductor chip 100BMb. FIG. 6A shows that the plurality of semiconductor chips 100*b* includes one first semiconductor chip 100BMb and one second semiconductor chip 100BNb, but it is not limited thereto. In FIG. 6A, the plurality of semiconductor chips 100*b* may include a plurality of first semiconductor chips 100BMb stacked to overlap each other in the vertical direction (Z direction), or may include a plurality of second semiconductor chips 100BNb stacked on the first semiconductor chip 100BMb to overlap each other in the vertical direction (Z direction) or stacked in a step shape.

In some embodiments, the first semiconductor chip 100BMb may be a central processor unit (CPU), a microprocessor unit (MPU), a graphics processor unit (GPU), or an application processor (AP), and the second semiconductor chip 100BNb may be a memory semiconductor chip, such as a non-volatile memory semiconductor chip or a volatile memory semiconductor chip.

In some other embodiments, the first semiconductor chip 100BMb may be a volatile memory semiconductor chip, and the second semiconductor chip 100BNb may be a non-volatile memory semiconductor chip.

The first semiconductor chip 100BMb may be stacked on the package base substrate 10 such that the active surface thereof faces downward, that is, the package base substrate 10. A plurality of chip connection terminals 125 may be attached to the plurality of first chip pads 110*a* disposed on the active surface of the first semiconductor chip 100BMb. A filling layer 134 surrounding the plurality of chip connection terminals 125 may be disposed between the first semiconductor chip 100BMb and the package base substrate 10.

The second semiconductor chip 100BNb may be stacked on the first semiconductor chip 100BMb such that an active surface thereof faces upward, that is, in a direction opposite to the package base substrate 10. The second semiconductor chips 100BNb may have a die adhesive film 132 attached to a lower surface thereof therebetween, and may be attached to a structure on the first semiconductor chip 100BMb.

A plurality of bonding wires 120 may be connected to the plurality of second chip pads 110*b* disposed on the active surface of the second semiconductor chip 100BNb.

The chip connection terminal 125 may electrically connect between the first chip pad 110a and an upper surface connection pad 22. The bonding wire 120 may electrically connect between the second chip pad 110b and the upper surface connection pad 22. A plurality of chip connection terminals 125 may be attached to some of the plurality of upper surface connection pads 22, and a plurality of bonding wires 120 may be connected to some others of the plurality of upper surface connection pads 22.

The four edges EDWc included in the edges of the first semiconductor chip 100BMb of the stacked semiconductor package 4 may all overlap with the second semiconductor chip 100BNb in the vertical direction (Z direction). Inner portions of the second semiconductor chip 100BN may be disposed on the edges EDWc of the first semiconductor chip 100BM.

The portion from a portion of the package base substrate 10 overlapping the four edges EDWc included in the edge of the first semiconductor chip 100BMb in the vertical direction (Z direction) extending a distance of a second gap G2c in opposite directions in the planar direction (XY direction) may be described as an overlapping chip edge region CERc. For example, the second gap G2c may have a value equal to or greater than the first gap G1. In some embodiments, the second gap G2c may have the same value as the first gap G1. In some other embodiments, the second gap G2c may have a value twice that of the first gap G1.

The portion from the portion of the package base substrate 10 overlapping the first semiconductor chip 100BM of the lowermost in the vertical direction (Z direction) extending a distance of a third gap G3 in the planar direction (XY direction) may be a chip attach region CSR.

Figure 7:
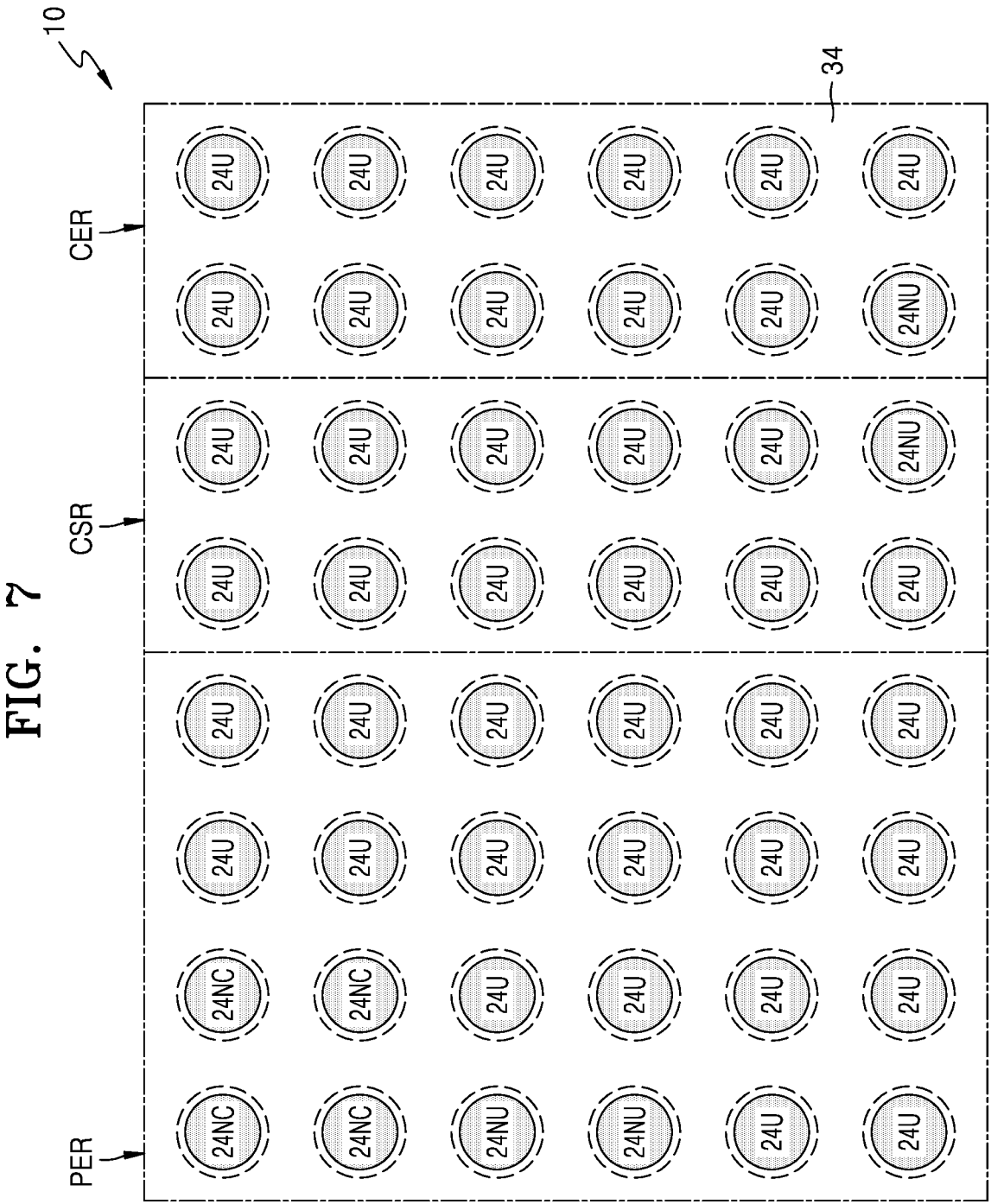
FIG. 7 is an example plan layout view of lower surface connection pads of a package base substrate according to an embodiment of the inventive concept.

FIG. 7 is an example plan layout view of lower surface connection pads of a package base substrate according to an embodiment of the inventive concept. For example, FIG. 7 is an exemplary plan layout view of a plurality of lower surface connection pads 24 included in the package base substrate 10 included in the semiconductor packages 1, 1a, 1b, and 1c shown in FIGS. 1A to 3B. However, the layout shown in FIG. 7 may be equally applied to an exemplary plan layout view of the plurality of lower surface connection pads 24 included in the package base substrate 10 of the semiconductor packages 2, 3, and 4 shown in FIGS. 4A to 6B. In this case, the overlapping chip edge region CER may be the overlapping chip edge regions CERa, WKRb, and WKRc.

Referring to FIG. 7, the package base substrate 10 may have an overlapping chip edge region CER, a chip attach region CSR, and a peripheral region PER. The plurality of lower surface connection pads 24 may be disposed on the lower surface of the package base substrate 10. FIG. 7 exemplarily shows only the ball land portion (BL of FIGS. 8A to 8E) among the plurality of lower surface connection pads 24. A portion adjacent to the edge of each of the plurality of lower surface connection pads 24 may be covered by the lower surface solder resist layer 34, and the remaining portion may be exposed without being covered. In some other embodiments, the lower surface solder resist layer 34 may not be formed and may be omitted.

More stress may be applied to the lower surface connection pad 24 disposed in the overlapping chip edge region CER and the chip attach region CSR compared to the lower surface connection pad 24 disposed in the peripheral region PER. In some embodiments, more stress may be applied to the lower surface connection pad 24 disposed in the overlapping chip edge region CER compared to the lower surface connection pad 24 disposed in the chip attach region CSR.

The plurality of lower surface connection pads 24 may include a plurality of function pads 24U. In some embodiments, the plurality of lower surface connection pads 24 may further include at least one non-function pad 24NU and/or at least one non-contact pad 24NC.

In some embodiments, the plurality of function pads 24U or the plurality of function pads 24U and at least one non-function pad 24NU may be disposed in the overlapping chip edge region CER and the chip attach region CSR. In some embodiments, the plurality of function pads 24U may be disposed in the peripheral region PER, or a plurality of function pads 24U, at least one non-function pad 24NU, and at least one non-contact pad 24NC may be disposed in the peripheral region PER.

The function pad 24U may be used to input/output a data signal, input a clock signal, and input a control signal to the plurality of semiconductor chips 100 or may be used to provide power or ground to the plurality of semiconductor chips 100. The function pad 24U may be connected to internal circuits in the plurality of semiconductor chips 100 configured to receive and use a data signal, a clock signal, a control signal, or a voltage. The non-function pad 24NU may not be used for the operation of the plurality of semiconductor chips 100. In some embodiments, a ground may be connected to the non-function pad 24NU, which ground is not electrically connected to any circuits in the plurality of semiconductor chips 100, for example. The non-contact pad 24NC may not be electrically connected to the plurality of semiconductor chips 100. For example, the non-contact pad 24NC may be electrically isolated and not connected to any wiring lines included in the package base substrate 10, and also not electrically connected to any circuits in the semiconductor chips. As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

The arrangement of the plurality of lower surface connection pads 24 shown in FIG. 7 is to describe the types of the lower surface connection pads 24 disposed in each of the overlapping chip edge region CER, the chip attach region CSR, and the peripheral region PER, and does not limit the positions at which each of the function pad 24U, the non-function pad 24NU, and the non-contact pad 24NC are arranged.

Figure 8A:
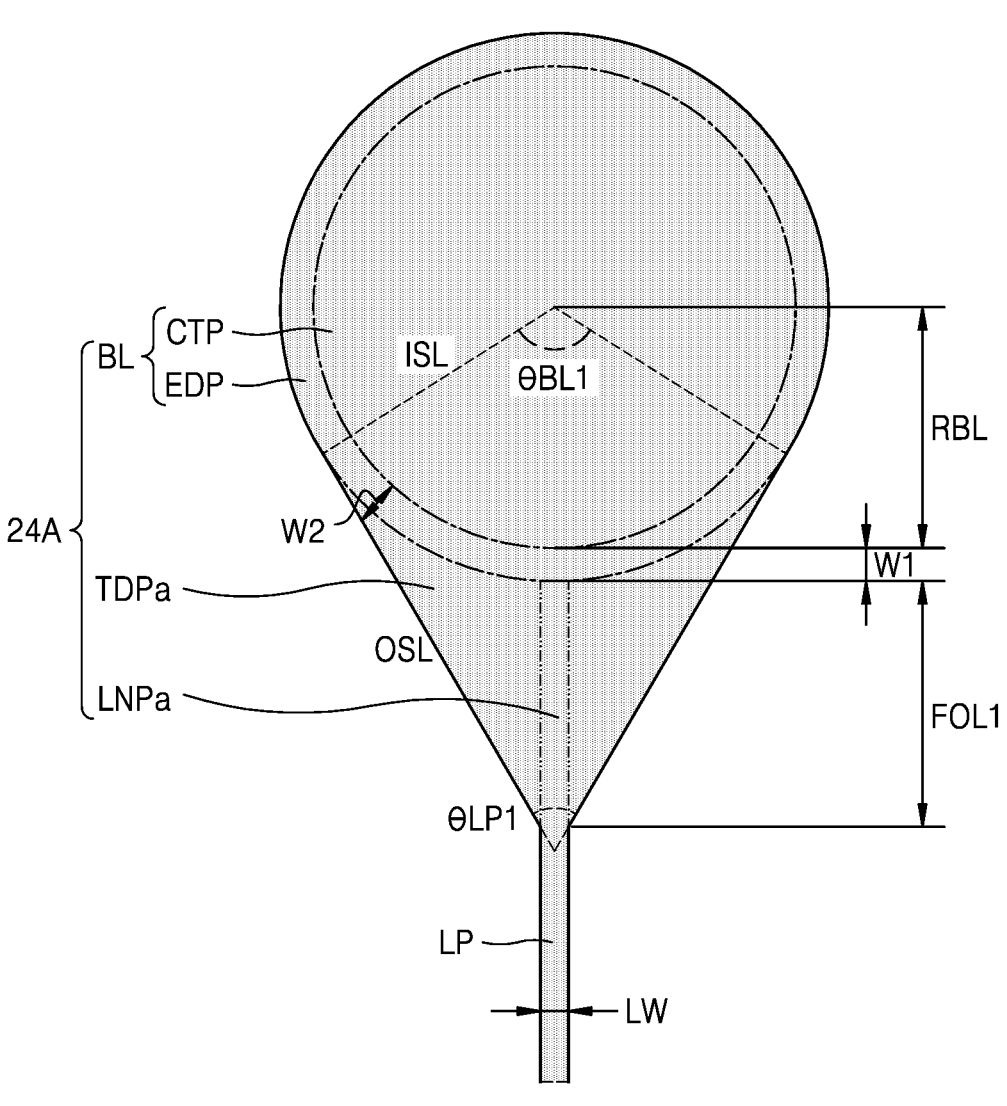
FIGS. 8A to 8E are plan views of a lower surface connection pad of a package base substrate according to embodiments of the inventive concept.

FIGS. 8A to 8E are plan views of a lower surface connection pad of a package base substrate according to an embodiment of the inventive concept Referring to FIG. 8A, a first connection pad 24A may be any one of the plurality of lower surface connection pads 24 described with reference to FIGS. 1A to 7.

The first connection pad 24A may be connected to a lower surface wiring pattern LP. Each of the first connection pad 24A and the lower surface wiring pattern LP may be formed at the same vertical level and may include or be formed of an ED copper foil, an RA copper foil, a stainless steel foil, an aluminum foil, an ultra-thin copper foil, sputtered copper, a copper alloy, or the like. For example, the first connection pad 24A may be formed of the same material as the lower surface wiring pattern LP to form an integral body.

The first connection pad 24A may include a ball land portion BL, an extension line portion LNPa, and a corner reinforcement portion TDPa. The ball land portion BL, the extension line portion LNPa, and the corner reinforcement portion TDPa may be integrally formed portions of the first connection pad 24A. The extension line portion LNPa and the corner reinforcement portion TDPa may be collectively referred to as a connection reinforcement portion. The first connection pad 24A may include the ball land portion BL and the connection reinforcement portion. The first connection pad 24A may have a teardrop shape in a plan view. The ball land portion BL may be a planarly circular portion of the first connection pad 24A, the extension line portion LNPa may be a portion having the same width as the lower surface wiring pattern LP of the first connection pad 24A and extending from the ball land portion BL between the ball land portion BL and the lower surface wiring pattern LP, and the corner reinforcement portion TDPa may be a portion that fills a corner between the ball land portion BL and the extension line portion LNPa in a plan view in the first connection pad 24A. The first connection pad 24A may have two corner reinforcement portions TDPa disposed on both sides of the extension line portion LNPa. The first connection pad may have a tear drop or ice cream cone shape, also described as a bird head shape (as seen from above) with the ball land portion BL being a head portion and the combined corner reinforcement portion TDPa and extension line portion LNPa being a beak portion.

Figure 8B:
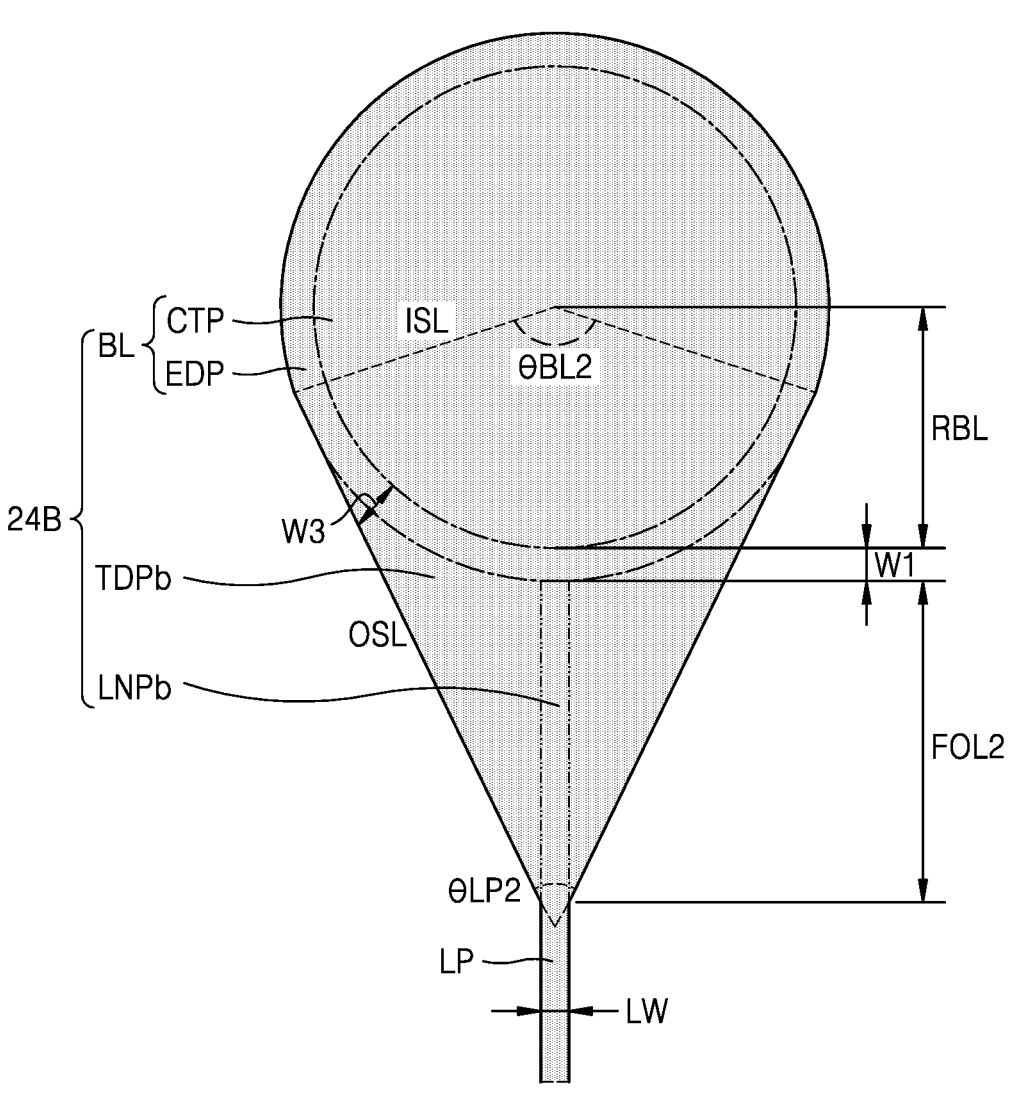
Figure 8C:
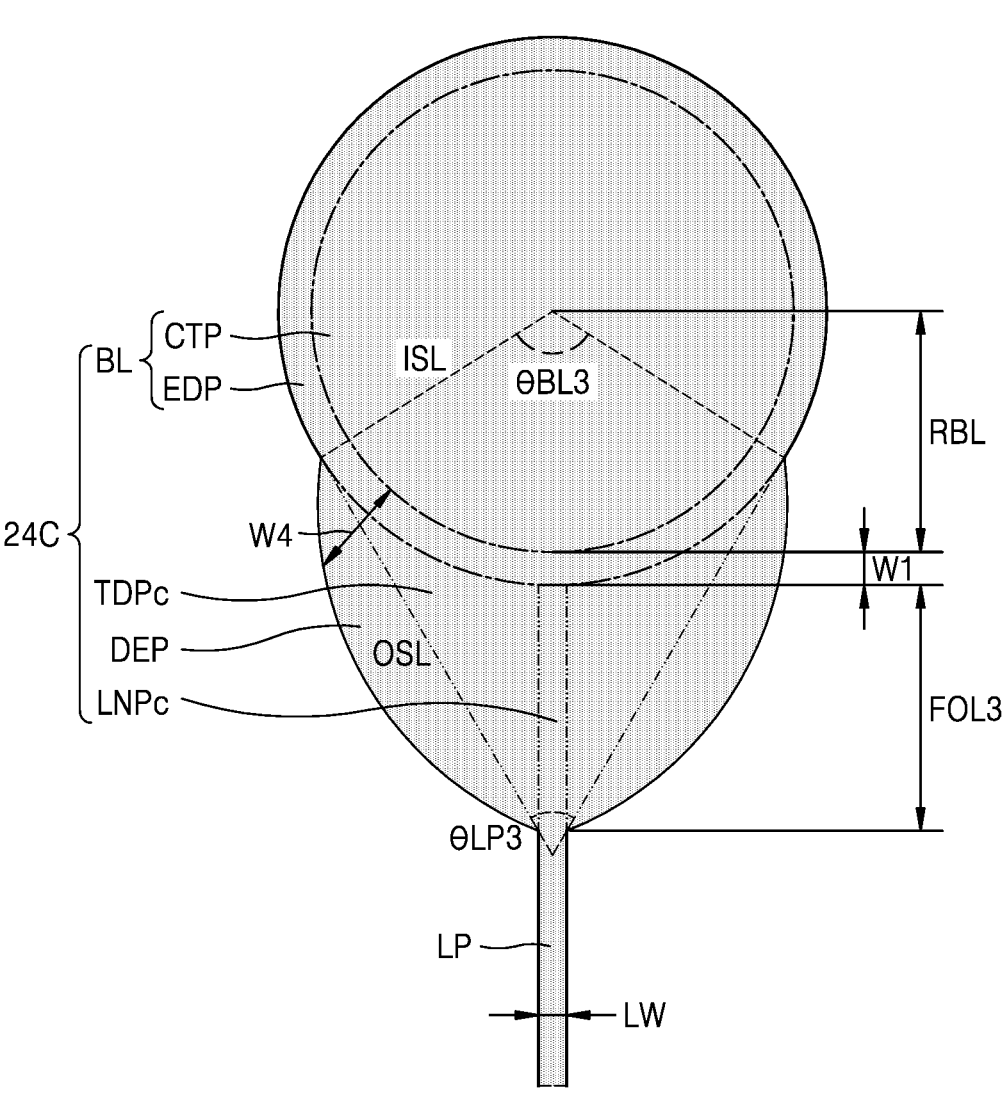
Figure 8D:
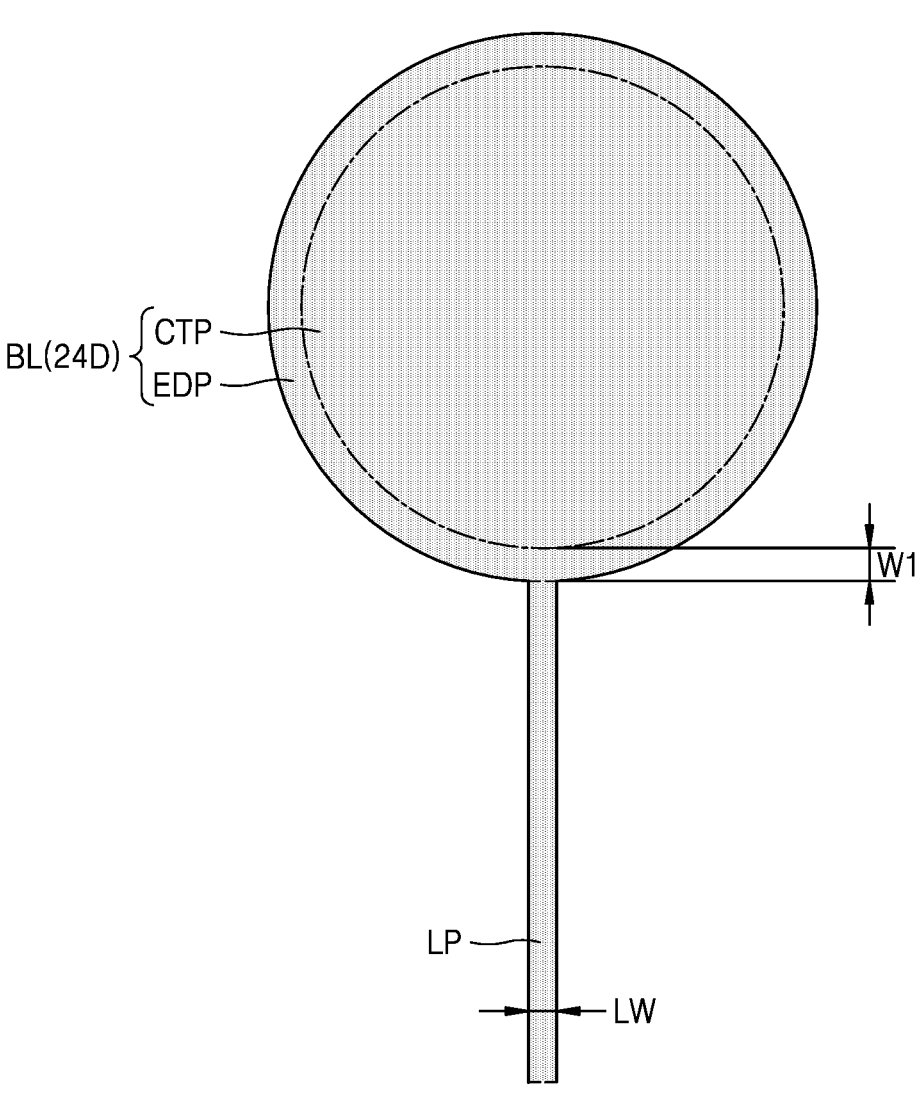

Like the fourth connection pad 24D shown in FIG. 8D, when the ball land portion BL and the lower surface wiring pattern LP are directly connected, the corner reinforcement portion TDPa may be a contact portion where the ball land portion BL is connected to the lower surface wiring pattern LP and a portion surrounding the contact portion and the extension line portion LNPa may be a portion of the lower surface wiring pattern LP between the two corner reinforcement portions TDPa. For example, the first connection pad 24A may be a result formed by designing to include a contact portion where the ball land portion BL is connected to the lower surface wiring pattern LP and two corner reinforcement portions TDPa surrounding the contact portion, based on the fourth connection pad 24D shown in FIG. 8D, and the extension line portion LNPa may be a portion surrounded by the two corner reinforcement portions TDPa and become a portion of the first connection pad 24A.

The ball land portion BL may include the terminal contact portion CTP and an edge portion EDP. The terminal contact portion CTP may be a portion exposed without being covered by the lower surface solder resist layer 34 described with reference to FIGS. 1A to 7, and the edge portion EDP may be a portion covered by the lower surface solder resist layer 34. In a plan view, the terminal contact portion CTP may have a circular shape, and the edge portion EDP may have a ring shape surrounding the periphery of the terminal contact portion CTP. The terminal contact portion CTP may have a first radius RBL, and the edge portion EDP may have a first width W1 and may extend to surround the periphery of the terminal contact portion CTP. The radius of the ball land portion BL may be the sum of the first radius RBL and the first width W1. The radius of the ball land portion BL may be referred to as a second radius. For example, the first radius RBL may be about 200 μm to about 300 μm, and the first width W1 may be about 5 μm to about 30 μm. The second radius may be about 205 μm to about 330 μm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The extension line portion LNPa may have a first extended length FOL1. The first extension length FOL1 may be the shortest distance between the ball land portion BL (e.g., an outer circumference of a circle on which the ball land portion BL is formed) and the lower surface wiring pattern LP, wherein the lower surface wiring pattern LP begins where it has a constant width along its length. The first extension length FOL1 may have a greater value than the first radius RBL.

The lower surface wiring pattern LP may have a first line width LW. For example, the first line width LW may be about 25 μm to about 50 μm. The extension line portion LNPa refers to a portion having a width equal to the first line width LW between the ball land portion BL and the lower surface wiring pattern LP among the connection reinforcement portions of the first connection pad 24A. Accordingly, the width of the extension line portion LNPa may have the same value as the first line width LW. The first radius RBL may have a value equal to or greater than 5 times the first line width LW.

In the extending direction of the lower surface wiring pattern LP extending from the first connection pad 24A, the length of the first connection pad 24A may be the sum of twice the first radius RBL, twice the first width W1, and the first extended length FOL1. That is, the length of the first connection pad 24A may be the sum of twice the second radius and the first extension length FOL1.

Two outer extension lines OSL may meet each other while forming a first line intersection angle θLP1, wherein the two outer extension line OSL are straight lines connecting a portion in contact with the edge of the ball land portion BL to a portion in contact with the edge of the lower surface wiring pattern LP among the outer edges of the two corner reinforcement portions TDPa on both sides of the extension line portion LNPa. The two outer extension lines OSL may spread and extend while having a first line intersection angle θLP1 toward the first connection pad 24A. In some embodiments, the outer edge of the corner reinforcement portion TDPa may extend along the outer extension line OSL.

Two inner extension lines ISL may meet each other while forming a first land intersection angle θBL1, wherein the two inner extension lines ISL are straight lines connecting a portion in contact with (e.g., connected to) the edge of the ball land portion BL among the outer edges of the two corner reinforcement portions TDPa on both sides of the extension line portion LNPa to the center (e.g., a center point) of the ball land portion BL. The two inner extension lines ISL may meet each other while forming a first land intersection angle θBL1 toward the corner reinforcement portion TDPa and the lower surface wiring pattern LP.

The first land intersection angle θBL1 may have a greater value than the first line intersection angle θLP1. The first land intersection angle θBLP1 may have a value greater than 90° and less than 180°, and the first line intersection angle θLP1 may have a value greater than 0° and less than 90°. In some embodiments, the first land intersection angle θBLP1 may be in a range of about 100° to about 140°, and the first line intersection angle θLP1 may be in a range of about 40° to about 80°.

A portion of the first connection pad 24A facing the lower surface wiring pattern LP may have a second width W2 greater than the first width W1 in width from the terminal contact portion CTP to the edge of the corner reinforcement portion TDPa. The second width W2 may be greater than the first width W1 and less than the sum of the first extended length FOL1 and the first width W1, and may increase as the second width W2 approaches the lower surface wiring pattern LP.

Because the first connection pad 24A according to the inventive concept has the connection reinforcement portion including the extension line portion LNPa and the corner reinforcement portion TDPa between the terminal contact portion CTP and the lower surface wiring pattern LP, even if the external connection terminal 50 described with reference to FIGS. 1A to 6B is attached to the terminal contact portion CTP, it is possible to prevent a crack from occurring between the first connection pad 24A and the lower surface wiring pattern LP due to the stress applied to the first connection pad 24A.

Referring to FIG. 8B, a second connection pad 24B may be any one of the plurality of lower surface connection pads 24 described with reference to FIGS. 1A to 7.

The second connection pad 24B may be connected to a lower surface wiring pattern LP. For example, the second connection pad 24B may be formed of the same material as the lower surface wiring pattern LP to form an integral body.

The second connection pad 24B may include a ball land portion BL, an extension line portion LNPb, and a corner reinforcement portion TDPb. The ball land portion BL, the extension line portion LNPb, and the corner reinforcement portion TDPb may be integrally formed portions of the second connection pad 24B. The extension line portion LNPb and the corner reinforcement portion TDPb may be collectively referred to as a connection reinforcement portion. The second connection pad 24B may include a ball land portion BL and the connection reinforcement portion. The second connection pad 24B may have a teardrop shape in a plan view. The ball land portion BL may be a planarly circular portion of the second connection pad 24A, the extension line portion LNPb may be a portion having the same width as the lower surface wiring pattern LP of the second connection pad 24B and extending from the ball land portion BL between the ball land portion BL and the lower surface wiring pattern LP, and the corner reinforcement portion TDPb may be a portion that fills a corner between the ball land portion BL and the extension line portion LNPb in a plan view in the second connection pad 24B. The second connection pad 24B may have two corner reinforcement portions TDPb disposed on both sides of the extension line portion LNPb.

The ball land portion BL may include a terminal contact portion CTP and an edge portion EDP. The extended line portion LNPb may have a second extended length FOL2. The second extended length FOL2 may be the shortest distance between the ball land portion BL and the lower surface wiring pattern LP. The second extension length FOL2 may have a greater value than the first radius RBL.

In the extending direction of the lower surface wiring pattern LP extending from the second connection pad 24B, the length of the second connection pad 24B may be the sum of twice the first radius RBL, twice the first width W1, and the second extended length FOL2. That is, the length of the second connection pad 24B may be the sum of twice the second radius and the second extension length FOL2.

Two outer extension lines OSL may meet each other while forming a second line intersection angle θLP2, wherein the two outer extension line OSL are straight lines connecting a portion in contact with the edge of the ball land portion BL to a portion in contact with the edge of the lower surface wiring pattern LP among the outer edges of the two corner reinforcement portions TDPb on both sides of the extension line portion LNPb. The two outer extension lines OSL may spread and extend while having a second line intersection angle θLP2 toward the second connection pad 24B. In some embodiments, the outer edge of the corner reinforcement portion TDPb may extend along the outer extension line OSL.

Two inner extension lines ISL may meet each other while forming a second land intersection angle θBL2, wherein the two inner extension lines ISL are straight lines connecting a portion in contact with (e.g., connected to) the edge of the ball land portion BL among the outer edges of the two corner reinforcement portions TDPb on both sides of the extension line portion LNPb to the center (e.g., center point) of the ball land portion BL. The two inner extension lines ISL may meet each other while forming a second land intersection angle θBL2 toward the corner reinforcement portion TDPb and the lower surface wiring pattern LP.

The second land intersection angle θBL2 may have a greater value than the second line intersection angle θLP2. The second land intersection angle θBLP2 may have a value greater than 90° and less than 180°, and the second line intersection angle θLP2 may have a value greater than 0° and less than 90°. In some embodiments, the second land intersection angle θBLP2 may be about 100° to about 140°, and the second line intersection angle θLP2 may be about 40° to about 80°.

A portion of the second connection pad 24B facing the lower surface wiring pattern LP may have a third width W3 greater than the first width W1 in width from the terminal contact portion CTP to the edge of the corner reinforcement portion TDPb. The third width W3 may be greater than the first width W1 and less than the sum of the second extended length FOL2 and the first width W1, and may increase as the third width W3 approaches the lower surface wiring pattern LP.

Referring to FIGS. 8A and 8B together, the first connection pad 24A may have a shape substantially similar to that of the second connection pad 24B. However, the second extended length FOL2 may have a greater value than the first extended length FOL1, the second land intersection angle θBLP2 may have a greater value than the first land intersection angle θBLP1, and the second line intersection angle θLP2 may have a less value than the first line intersection angle θLP1. The third width W3 based on the same position of the ball land portion BL may have a greater value than the second width W2. Accordingly, the extended length of the second connection pad 24B may be greater than the extended length of the first connection pad 24A. For example, the area of the second connection pad 24B may be larger than that of the first connection pad 24A.

Referring to FIG. 8C, a third connection pad 24C may be any one of the plurality of lower surface connection pads 24 described with reference to FIGS. 1A to 7.

The third connection pad 24C may be connected to the lower surface wiring pattern LP. For example, the third connection pad 24B may be formed of the same material as the lower surface wiring pattern LP to form an integral body.

The third connection pad 24C may include a ball land portion BL, an extension line portion LNPc, a corner reinforcement portion TDPc, and a bulging reinforcement portion DEP. The ball land portion BL, the extension line portion LNPc, the corner reinforcement portion TDPc, and the bulging reinforcement portion DEP may be integrally formed portions of the first connection pad 24A. The extension line portion LNPc and the corner reinforcement portion TDPc may be collectively referred to as a connection reinforcement portion. The third connection pad 24C may include the ball land portion BL and the connection reinforcement portion. The third connection pad 24C may have a modified teardrop, or bird head shape in a plan view, e.g., a duckbill shape with the ball land portion BL being a head portion and the combined corner reinforcement portion TDPc and extension line portion LNPc being a bill portion. The ball land portion BL may be a portion having a planar circular shape in the third connection pads 24C, the extension line portion LNPc may be a portion extending between the ball land portion BL and the lower surface wiring pattern LP and having the same width as the lower surface wiring pattern LP in the third connection pads 24C, the corner reinforcement portion TDPc may be a portion that fills a corner between the ball land portion BL and the extension line portion LNPc in a plan view in the third connection pads 24C, and the bulging reinforcing portion DEP is a portion disposed outside the edge reinforcing portion TDPc to form an outwardly bulging shape (e.g., a convex shape) of the connection reinforcing portion. The third connection pad 24C includes two edge reinforcement portions TDPc disposed on opposite sides of the extension line portion LNPc and two bulging reinforcement portions DEP disposed outside the two edge reinforcement portions TDPc.

The ball land portion BL may include a terminal contact portion CTP and an edge portion EDP. The extended line portion LNPc may have a third extended length FOL3. The third extended length FOL3 may be the shortest distance between the ball land portion BL and the lower surface wiring pattern LP. The third extension length FOL3 may have a value greater than the first radius RBL.

Two outer extension lines OSL may meet each other while forming a third line intersection angle θLP3, wherein the two outer extension line OSL are straight lines connecting a portion in contact with the edge of the ball land portion BL to a portion in contact with the edge of the lower surface wiring pattern LP among the outer edges of the two corner reinforcement portions TDPc on both sides of the extension line portion LNPc. The two outer extension lines OSL may spread and extend while having a third line intersection angle θLP3 toward the third connection pad 24C. In some embodiments, the corner reinforcement portion TDPc and the bulging reinforcement portion DEP may be divided based on the outer extension line OSL.

Two inner extension lines ISL, which connect a portion in contact with the edge of the ball land portion BL among the outer edges of the two bulging reinforcement portions DEP on both sides of the extension line portion LNPc to the center of the ball land portion BL, may meet each other while forming a third land intersection angle θBL3. The two inner extension lines ISL may meet each other while forming a third land intersection angle θBL3 toward the corner reinforcement portion TDPc and the lower surface wiring pattern LP.

The third land intersection angle θBL3 may have a greater value than the third line intersection angle θLP3. The third land intersection angle θBLP3 may have a value greater than 90° and less than 180°, and the third line intersection angle θLP3 may have a value greater than 0° and less than 90°. In some embodiments, the third land intersection angle θBLP3 may be in a range of about 100° to about 140°, and the third line intersection angle θLP3 may be in a range of about 40° to about 80°.

A portion of the third connection pad 24C facing the lower surface wiring pattern LP may have a fourth width W4 greater than the first width W1 in width from the terminal contact portion CTP to the edge of the corner reinforcement portion TDPc. The fourth width W4 may be greater than the first width W1 and less than the sum of the third extended length FOL3 and the first width W1, and may increase as the fourth width W4 approaches the lower surface wiring pattern LP.

Referring to FIGS. 8A to 8C together, the third connection pad 24C may have a shape in which the first connection pad 24A or the second connection pad 24B further includes the bulging reinforcement portion DEP. Accordingly, the area of the third connection pad 24C may be larger than that of the first connection pad 24A or the second connection pad 24B. For example, the third extended length FOL3 may have the same value as the first extended length FOL1 or the second extended length FOL2, the third land intersection angle θBLP3 may have the same value as the first land intersection angle θBLP1 or the second land intersection angle θBLP2, and the third line intersection angle θLP3 may have the same value as the first line intersection angle θLP1 or the second line intersection angle θLP2, but is not limited thereto. The fourth width W4 based on the same position of the ball land portion BL may have a greater value than the first width W1 or the second width W2. As can be seen in FIGS. 8A-8C, all of these examples include a connection pad that includes a ball land portion that is circular, and an extension portion connected to the ball land portion and that extends in a tapered manner from where it connects to the ball land portion to where the extension portion ends and connects to a straight lower surface wiring pattern LP. The lower surface wiring pattern LP in these examples extends along a line that intersects an outer edge of the ball land portion in a direction perpendicular to the outer edge that it intersects.

Referring to FIG. 8D, a fourth connection pad 24B may be any one of the plurality of lower surface connection pads 24 described with reference to FIGS. 1A to 7.

The fourth connection pad 24D may be directly connected to the lower surface wiring pattern LP. For example, the fourth connection pad 24D may be formed of the same material as the lower surface wiring pattern LP to form an integral body.

The fourth connection pad 24D may have a ball land portion BL. The fourth connection pad 24D may have a circular shape in a plan view. The ball land portion BL may include a terminal contact portion CTP and an edge portion EDP.

Unlike the first connection pad 24A, the second connection pad 24B, and the third connection pad 24C, the fourth connection pad 24D may not have a connection reinforcement portion.

Figure 8E:
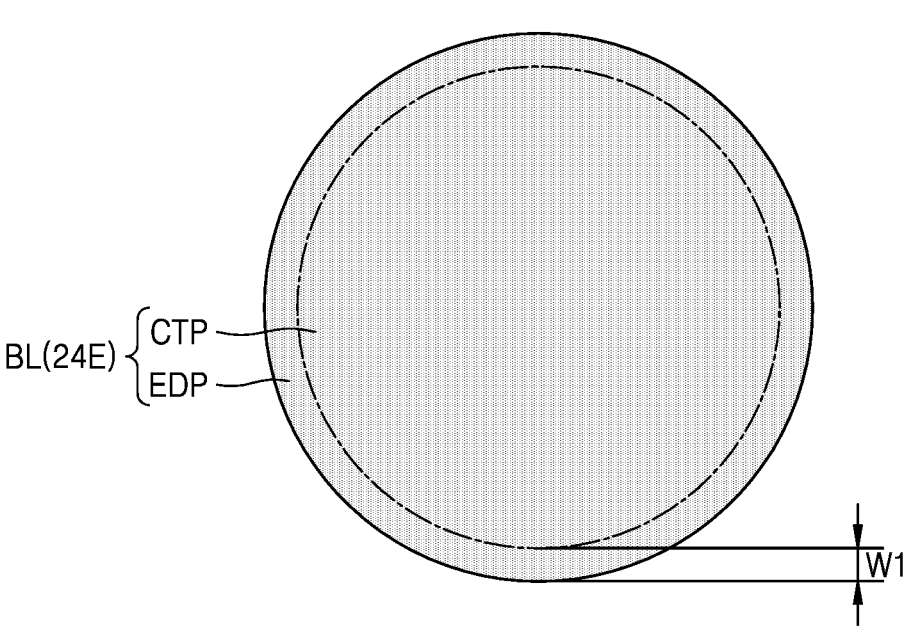

Referring to FIG. 8E, a fifth connection pad 24E may be any one of the plurality of lower surface connection pads 24 described with reference to FIGS. 1A to 7.

The fifth connection pad 24E may not be connected to the lower surface wiring pattern LP shown in FIGS. 8A to 8D. For example, the fifth connection pad 24E may have an island shape that is not connected to the lower surface wiring pattern LP shown in FIGS. 8A to 8D.

The fifth connection pad 24E may have a ball land portion BL. The fifth connection pad 24E may have a circular shape in a plan view. The ball land portion BL may include a terminal contact portion CTP and an edge portion EDP.

Referring to FIGS. 7 to 8E together, the package base substrate 10 may include a plurality of lower surface connection pads 24, and each of the plurality of lower surface connection pads 24 may be any one of the first connection pad 24A, the second connection pad 24B, the third connection pad 24C, the fourth connection pad 24D, and the fifth connection pad 24E. In some embodiments, each of the function pad 24U and the non-function pad 24NU disposed in the overlapping chip edge region CER, the function pad 24U and the non-function pad 24NU disposed in the chip attach region CSR, and the function pad 24U, the non-function pad 24NU, and the non-contact pad 24NC disposed in the peripheral region PER may be any one of the first connection pad 24A, the second connection pad 24B, the third connection pad 24C, the fourth connection pad 24D, and the fifth connection pad 24E, which will be described in detail with reference to FIGS. 9A to 9P.

Figure 9A:
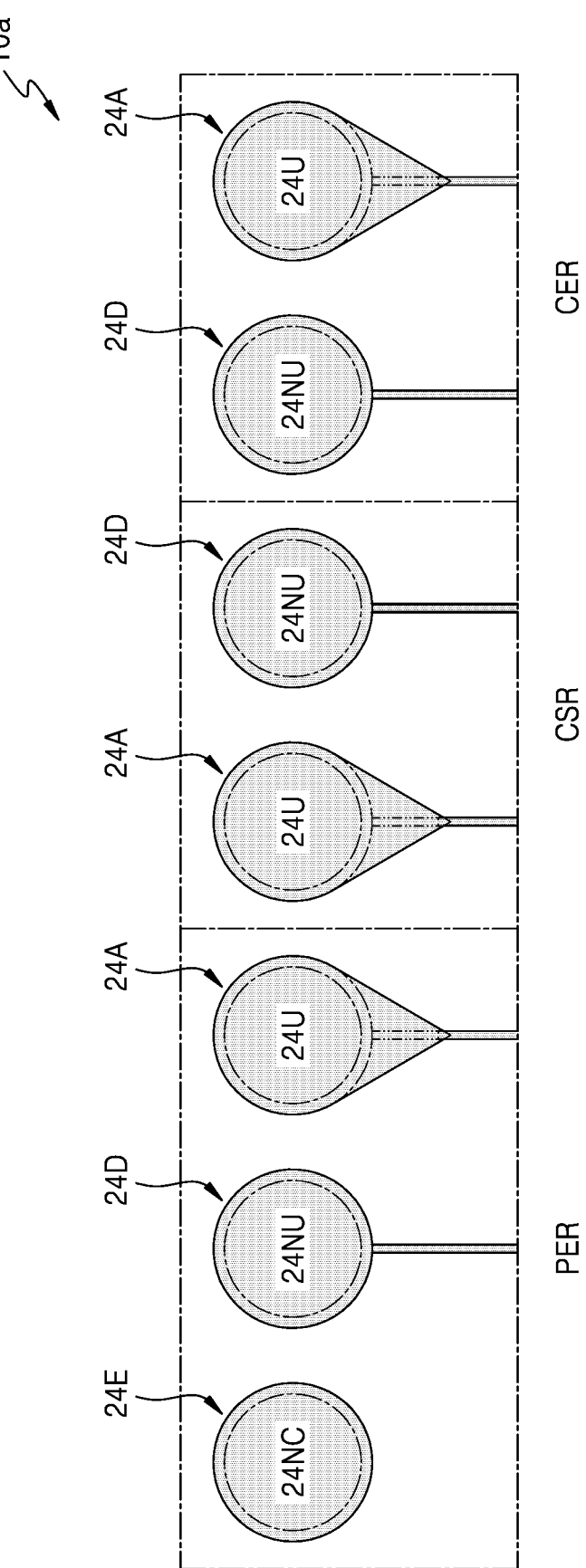
FIGS. 9A to 9P are conceptual views illustrating lower surface connection pads included in a package base substrate according to embodiments of the inventive concept.
Figure 9B:
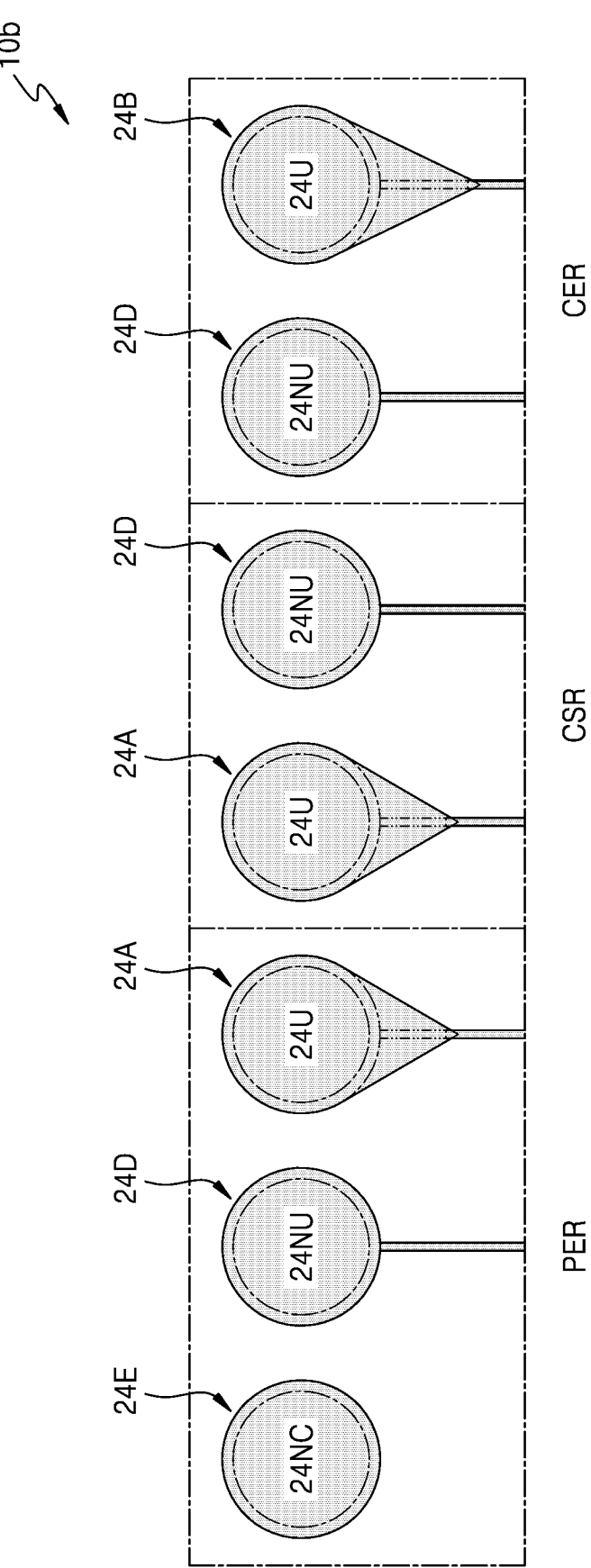
Figure 9C:
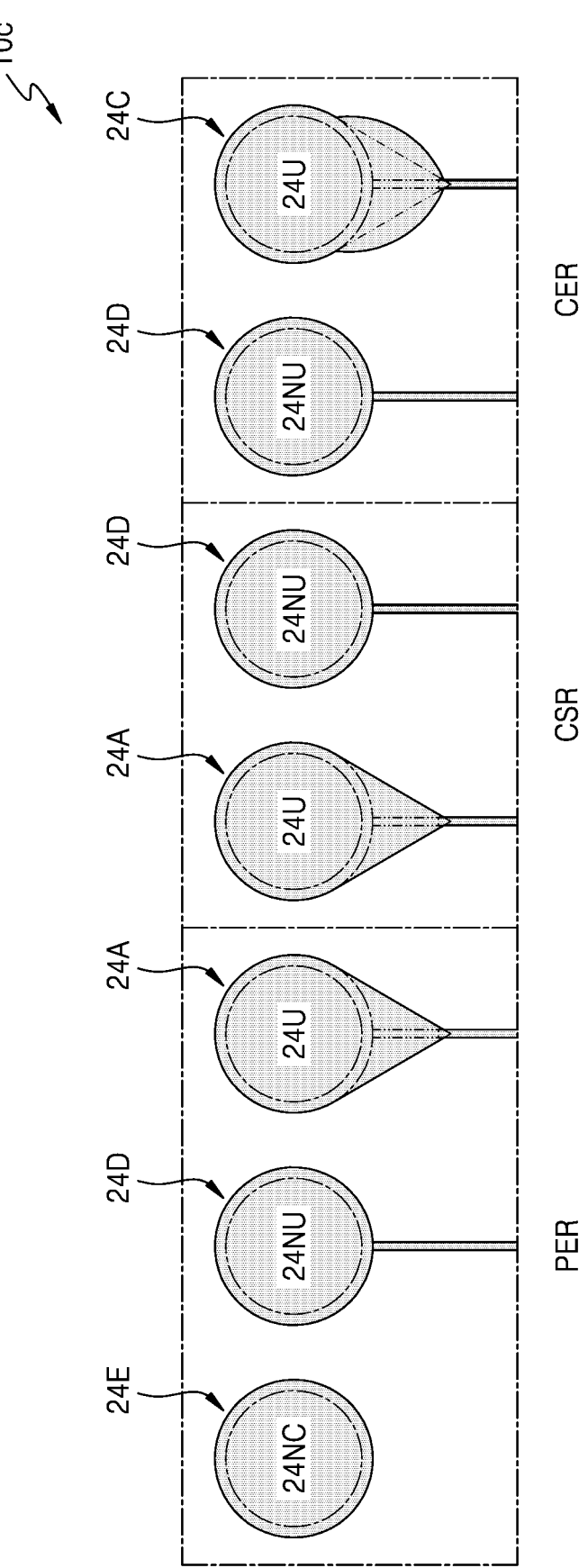
Figure 9D:
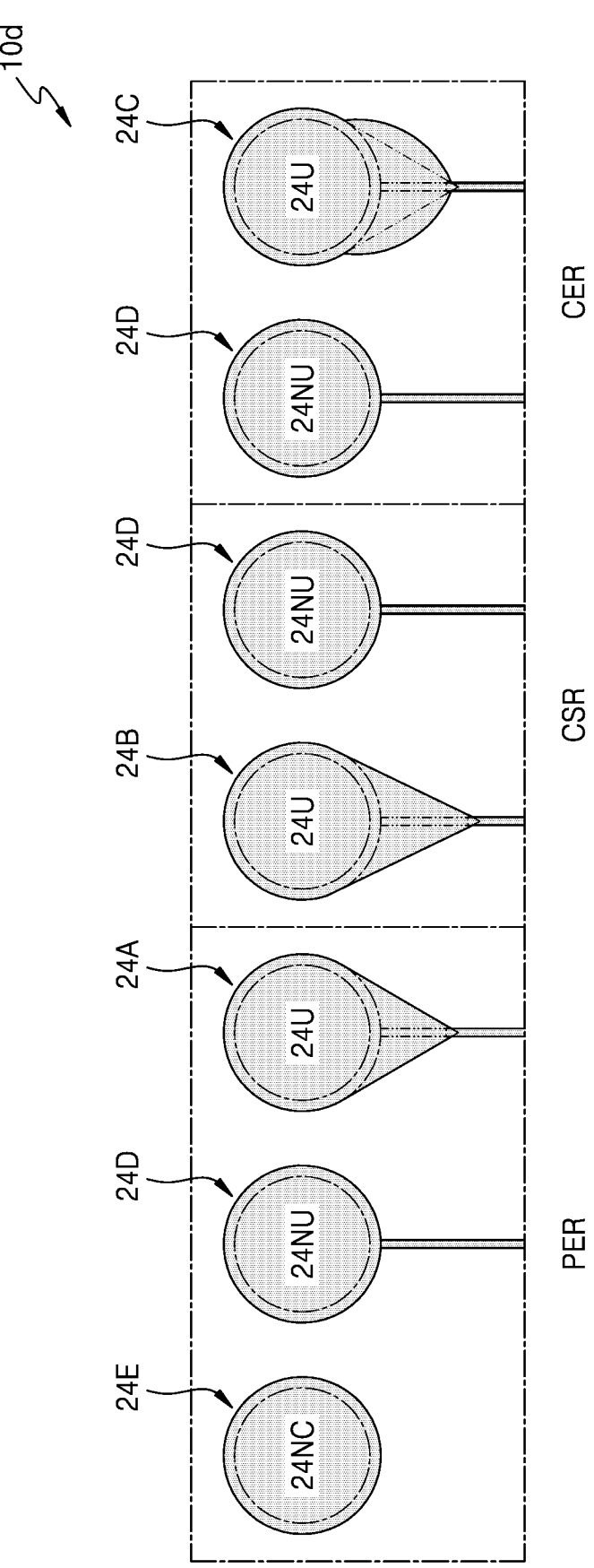
Figure 9E:
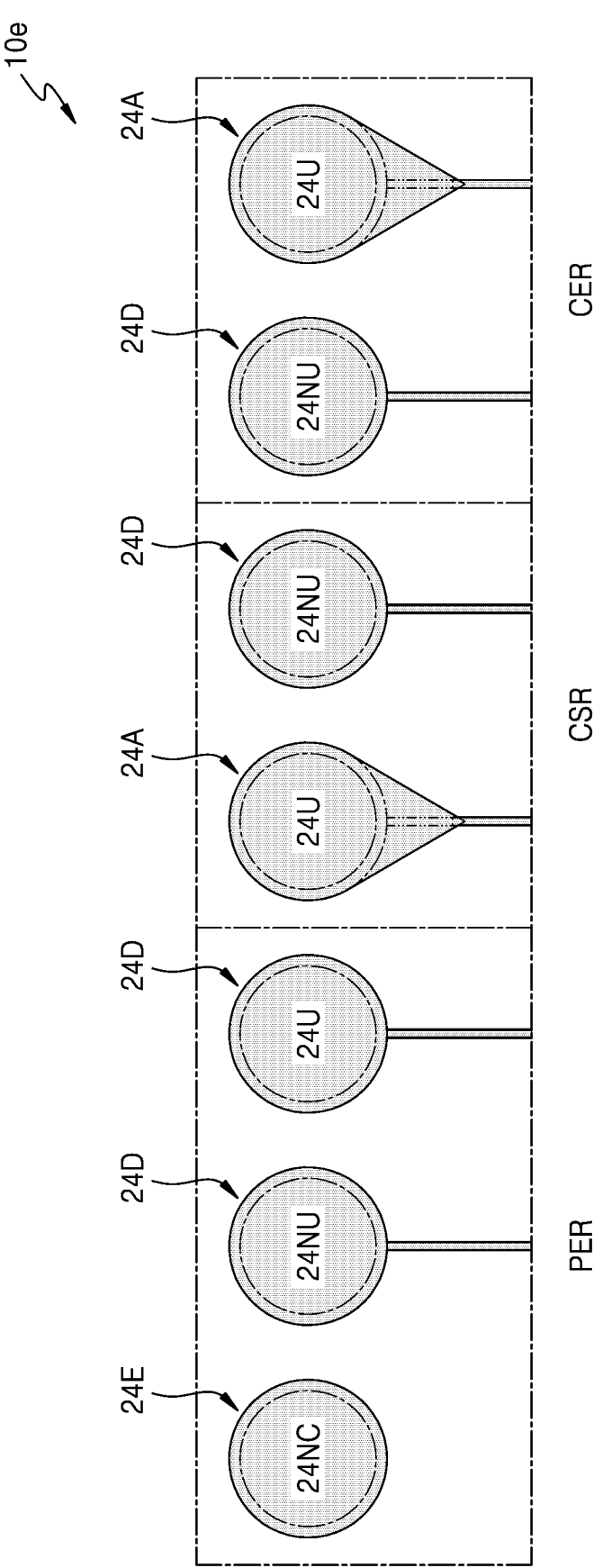
Figure 9F:
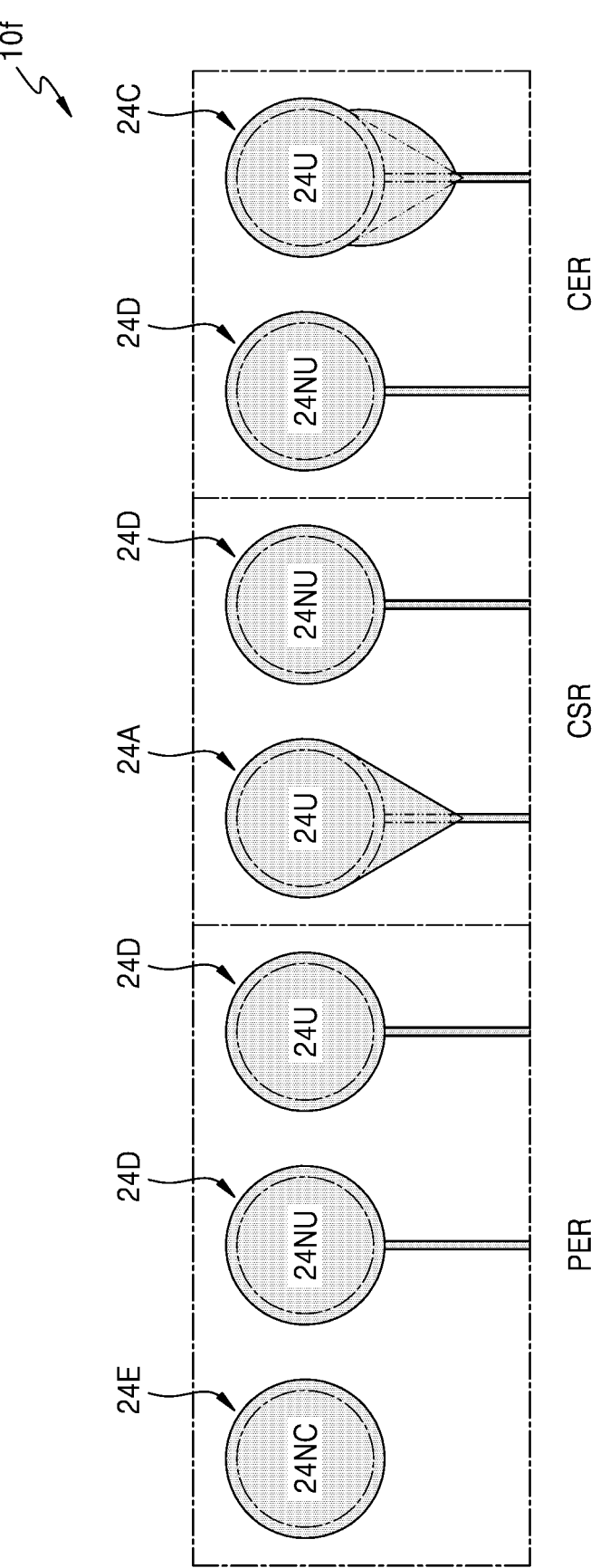
Figure 9G:
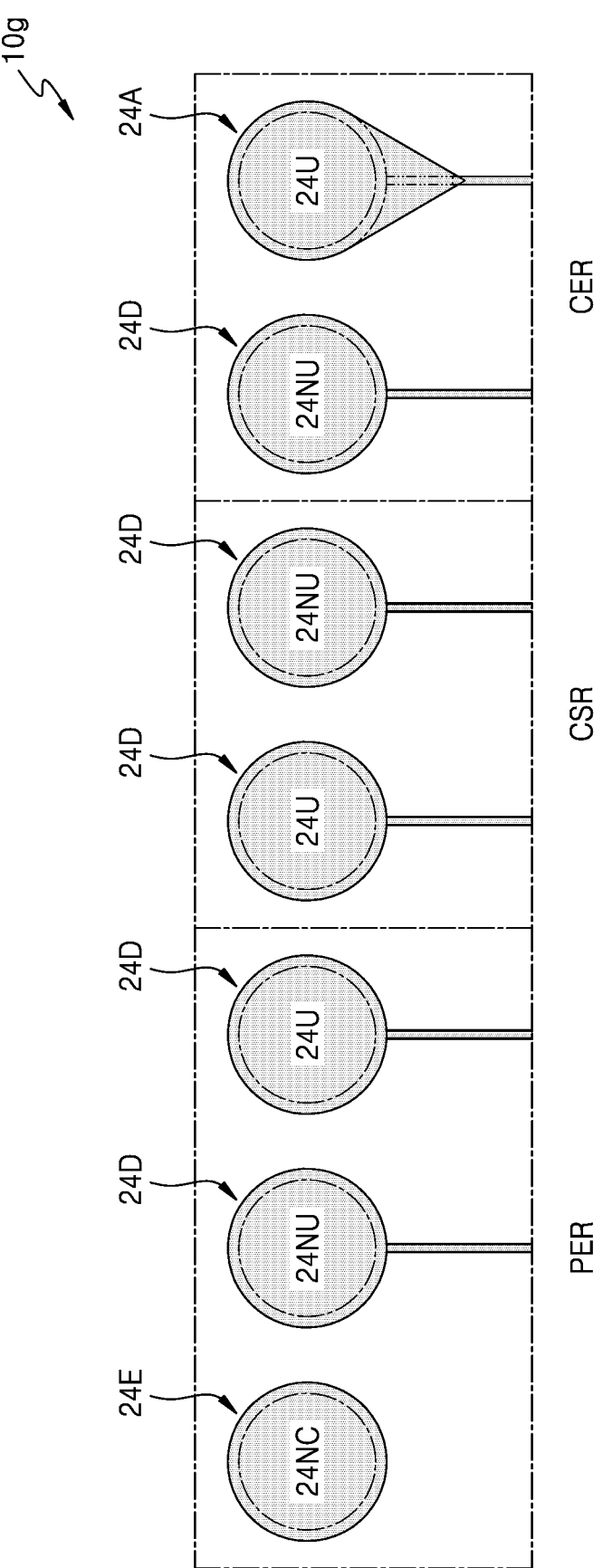
Figure 9H:
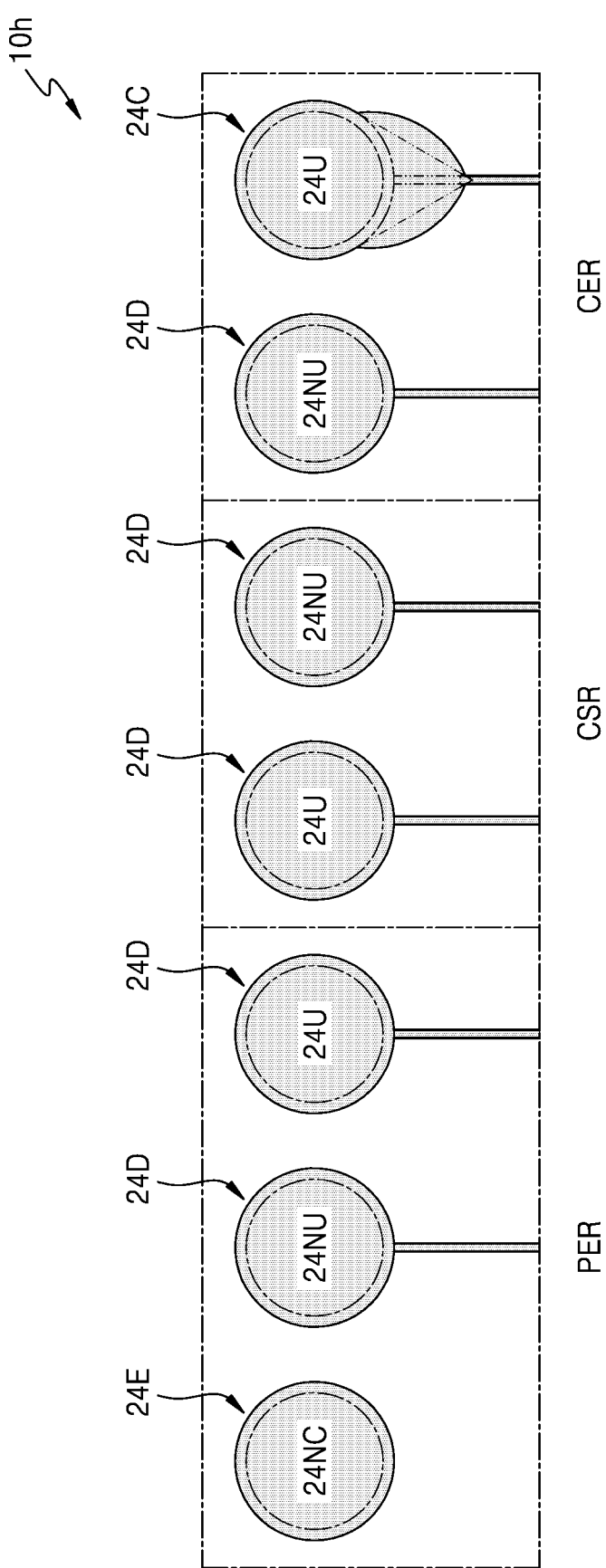
Figure 9I:
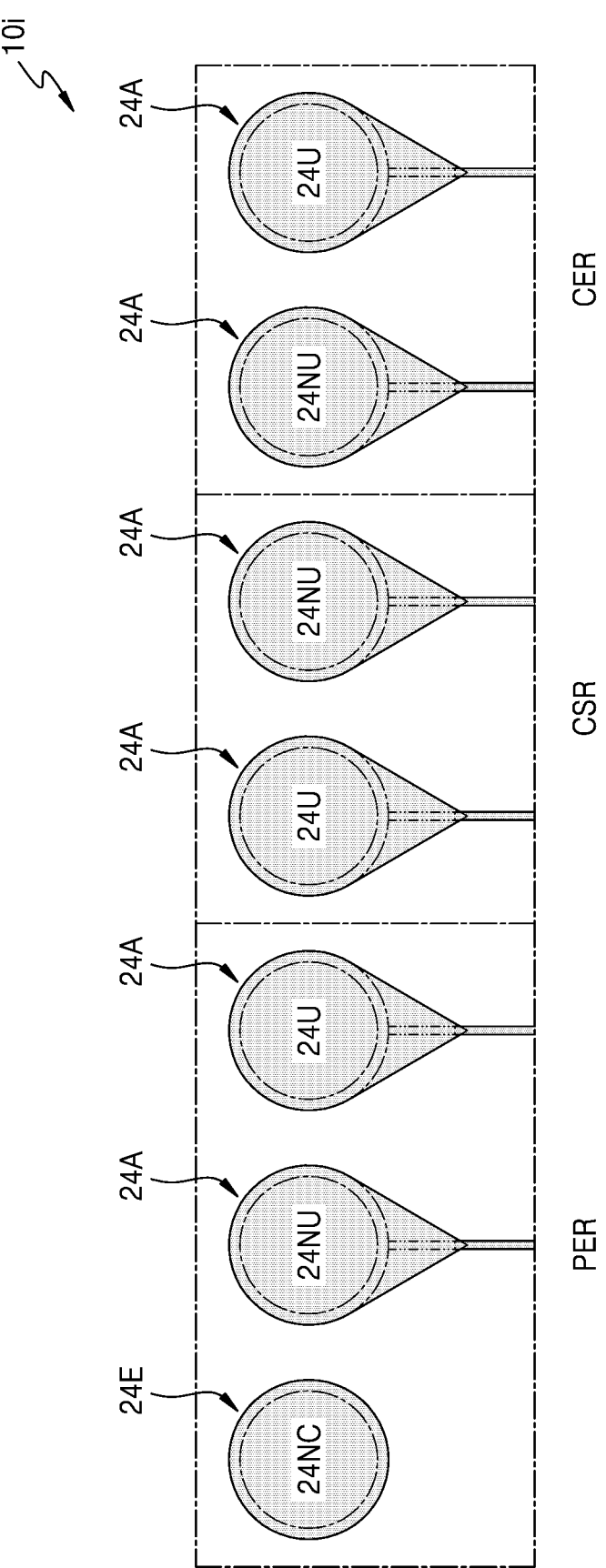
Figure 9J:
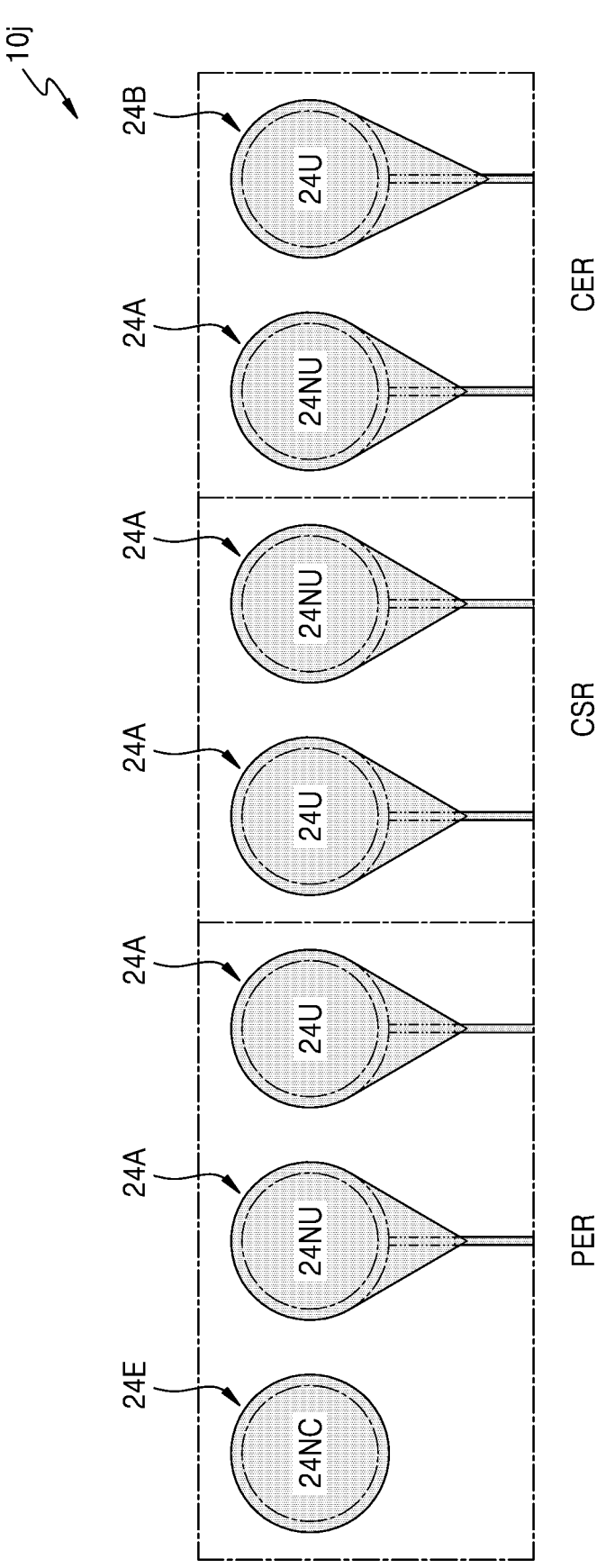
Figure 9K:
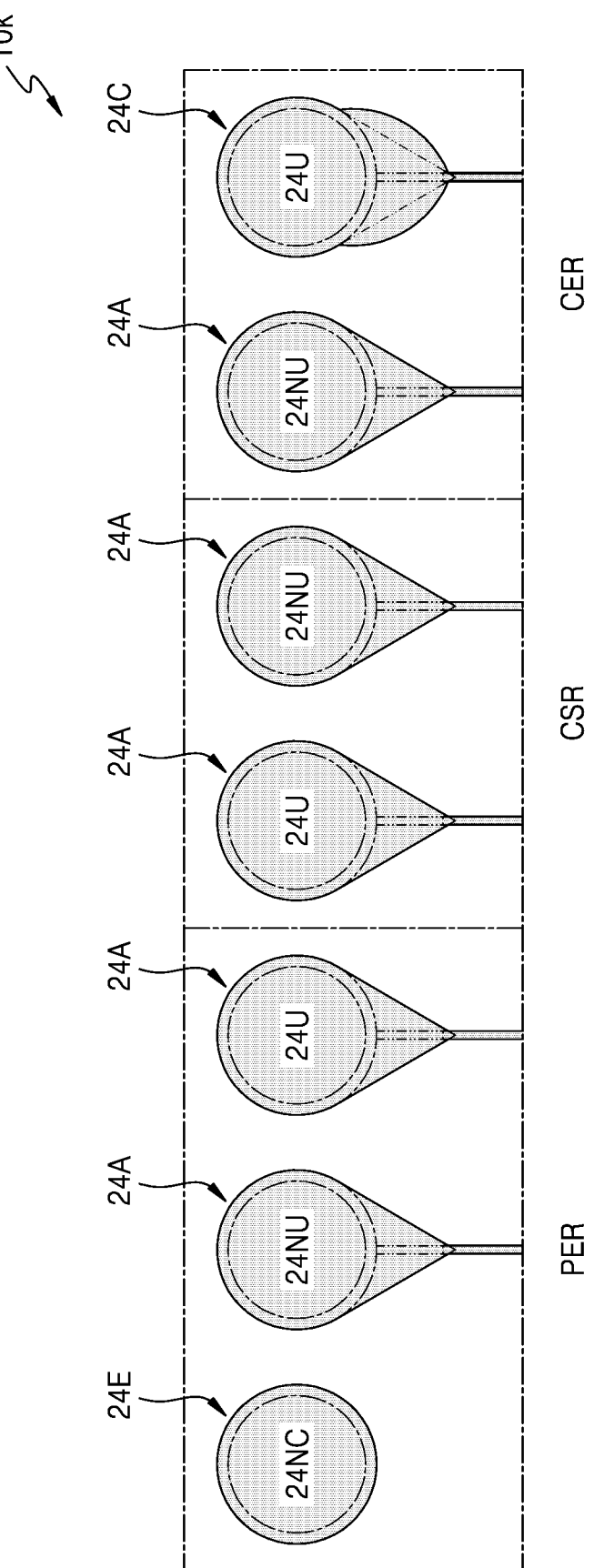
Figure 9L:
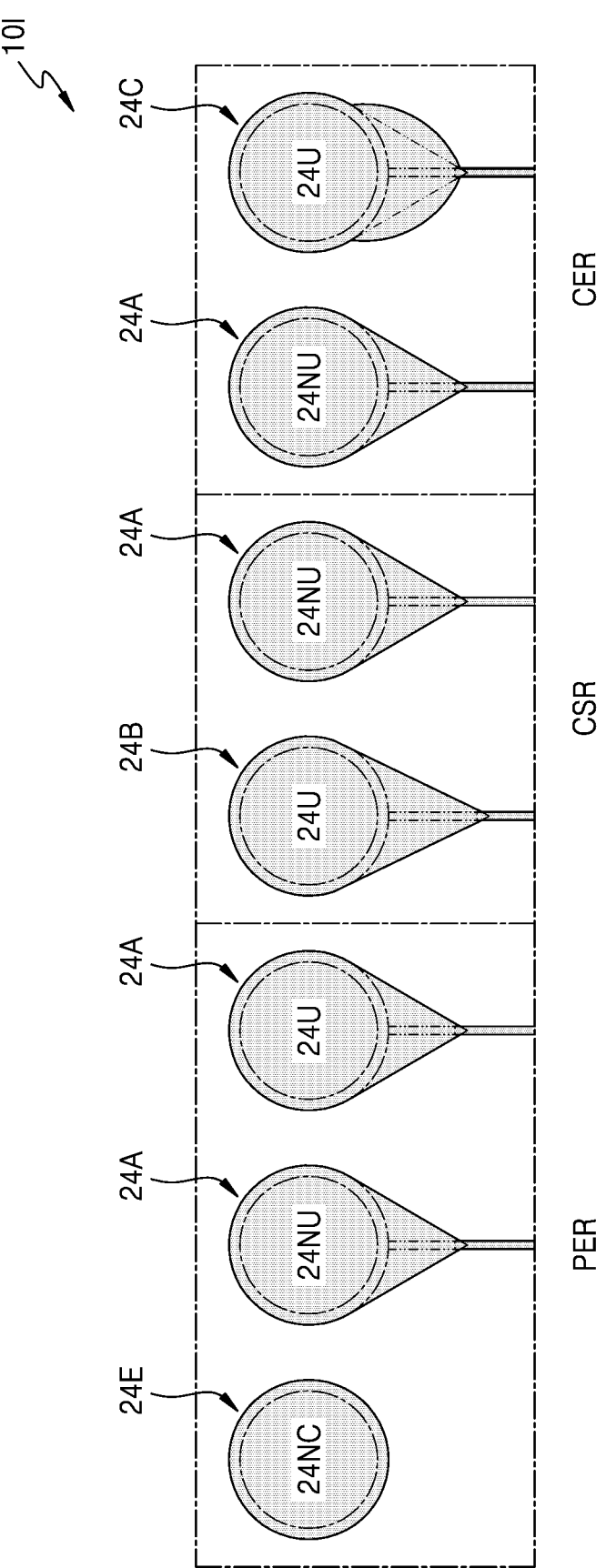
Figure 9M:
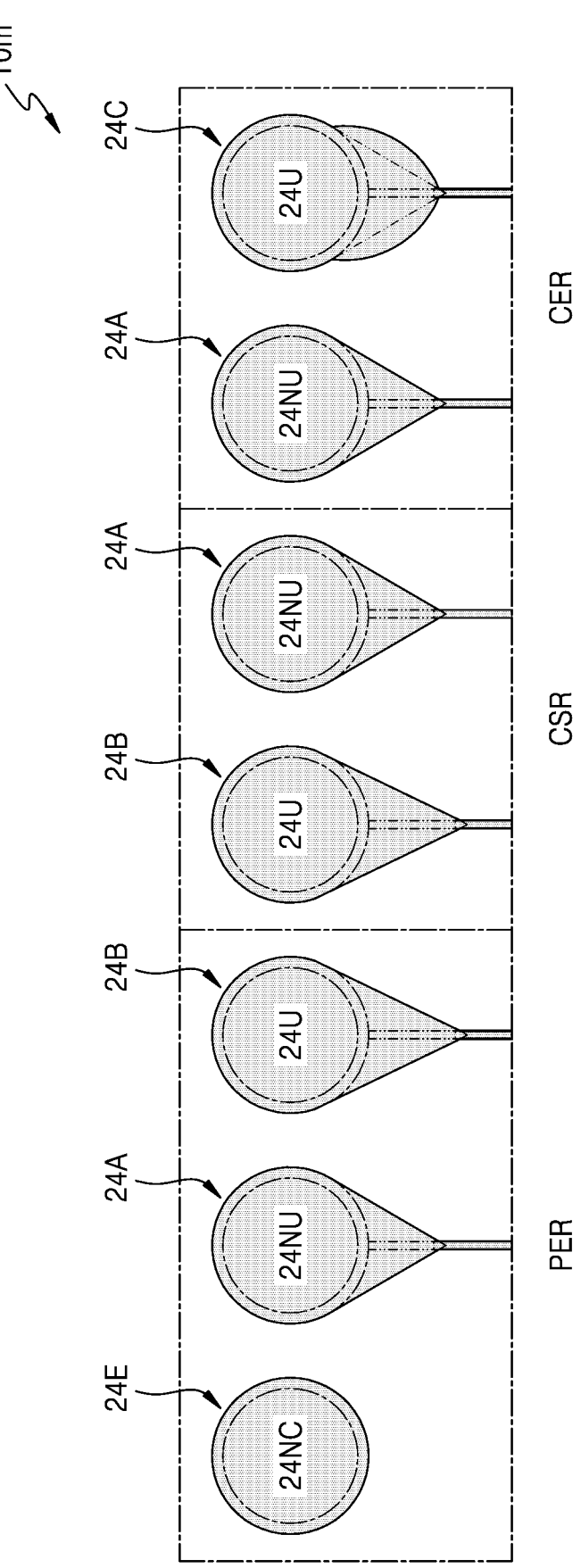
Figure 9N:
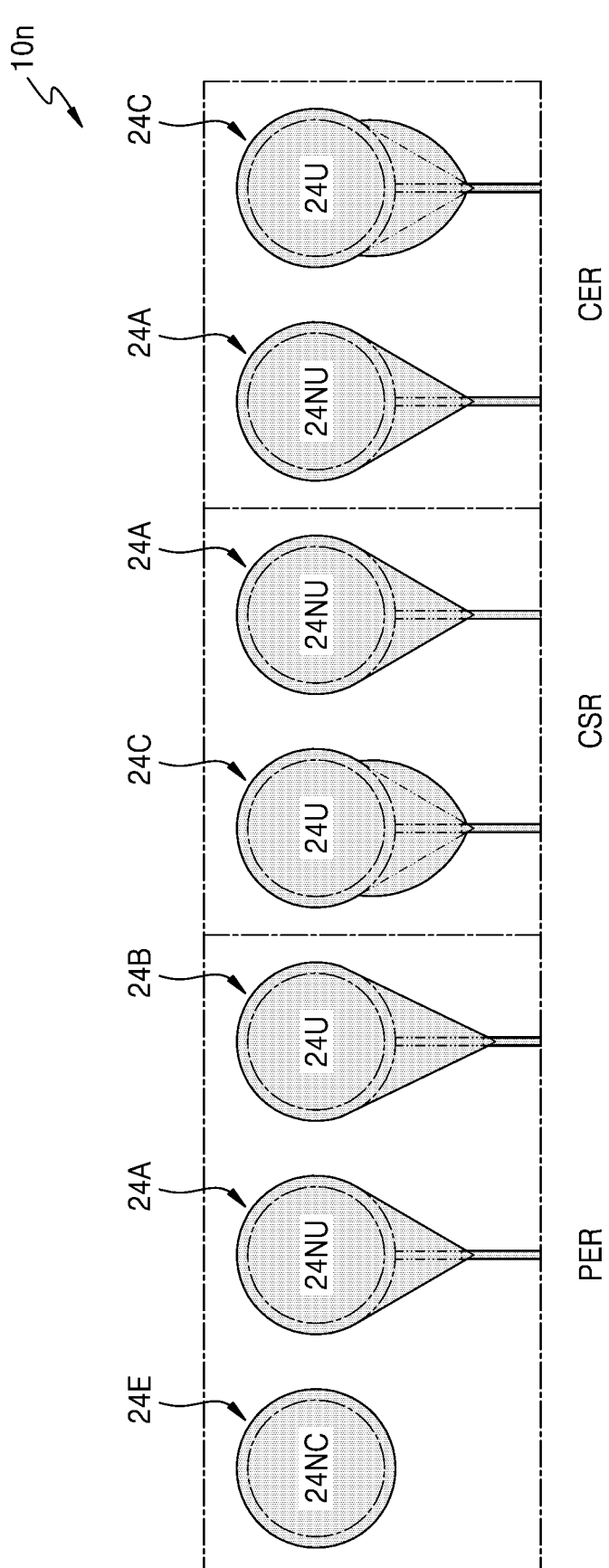
Figure 90:
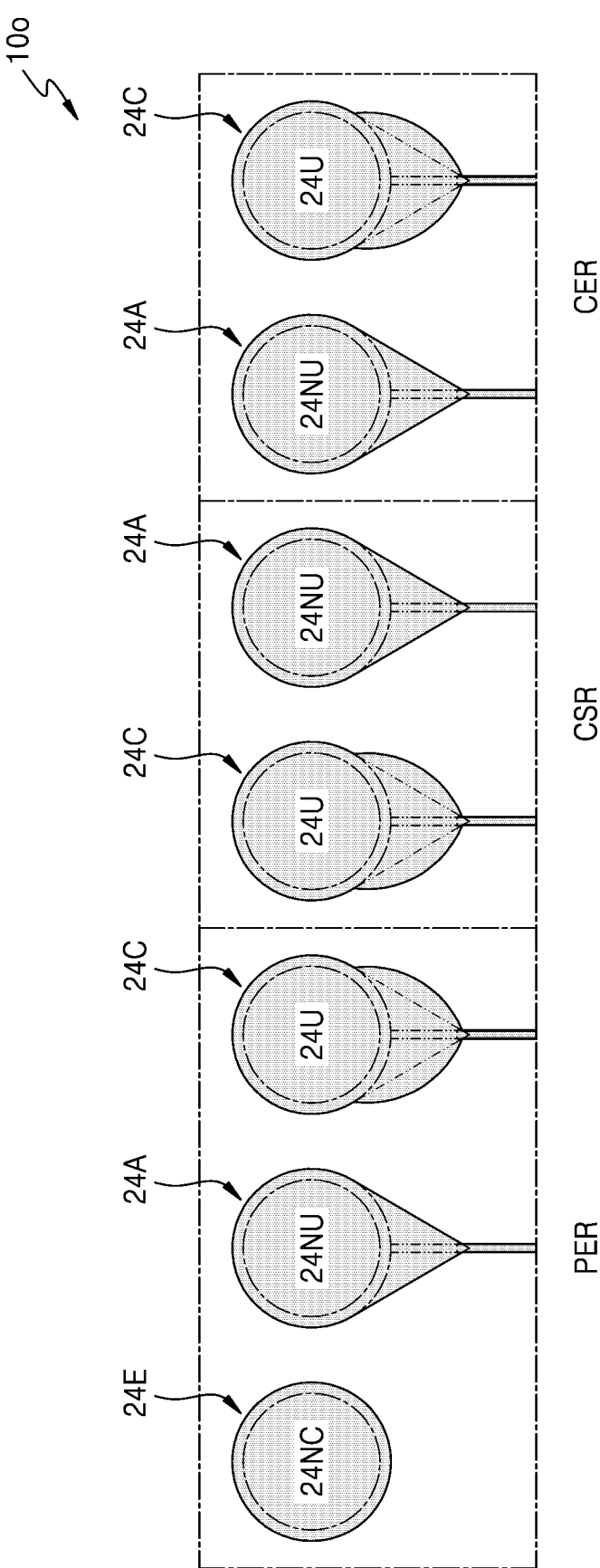
Figure 9P:
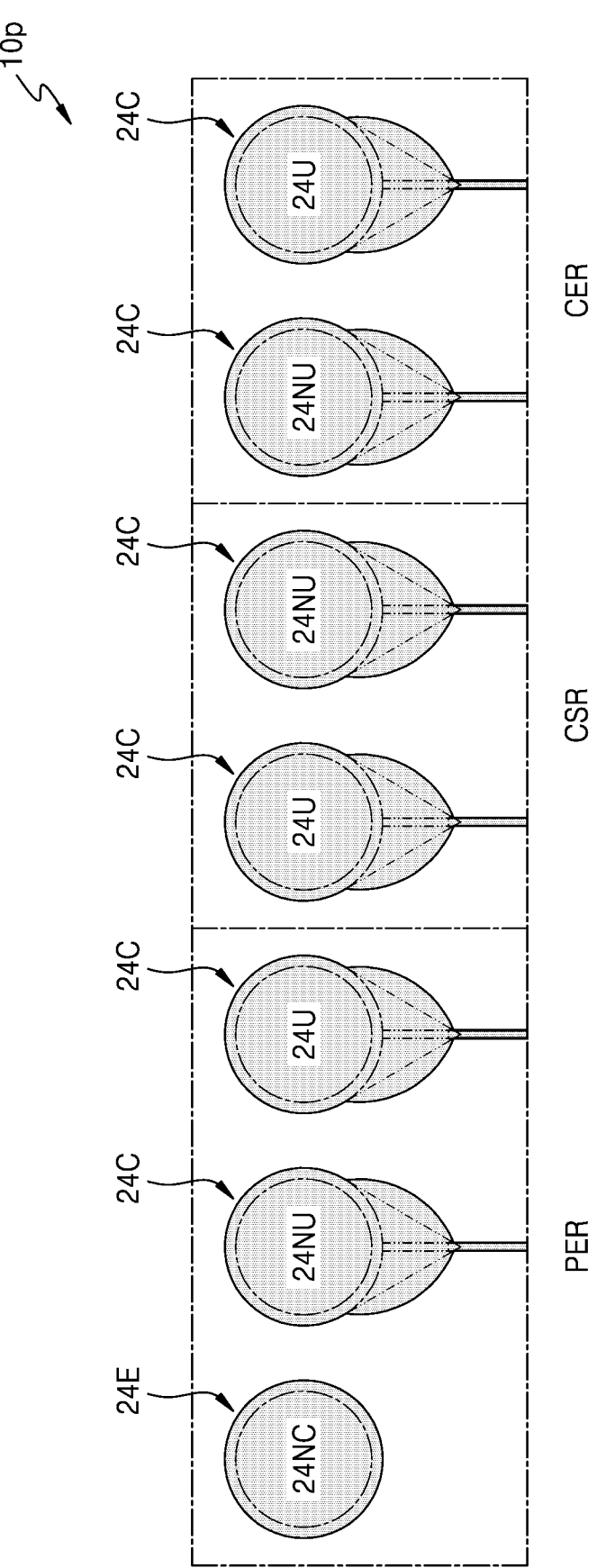

FIGS. 9A to 9P are conceptual views illustrating lower surface connection pads included in a package base substrate according to an embodiment of the inventive concept. The description of FIGS. 9A to 9P may refer to FIGS. 8A and 8E together.

Referring to FIG. 9A, a package base substrate 10a may have an overlapping chip edge region CER, a chip attach region CSR, and a peripheral region PER. The package base substrate 10a may be the package substrate 10 described with reference to FIGS. 1A to 7. The chip edge region CER may be, for example, a region formed in an XY direction that surrounds a location where the chip edges of a lowermost chip of a chip stack overlap other chips of the chip stack or align with chip edges of the other chips. The chip edge region may extend, in a perpendicular direction to the chip edges direction, a particular distance away from the chip edges in opposite directions. The particular distance, in each direction, may be, for example greater than the diameter of a ball land portion of a lower surface connection pad, and up to the diameter of four times the ball land portion of a lower surface connection pad. The chip attach region CSR may include the chip edge region CER and may extend beyond the chip edge region CER. The chip attach region CSR may include a region where the lowermost chip in the stack of chips is adhered the package substrate 10 as well as an addition region outside the adhering region extending up to the peripheral region PER.

A function pad 24U and a non-function pad 24NU may be disposed in the overlapping chip edge region CER. In some embodiments, only the function pad 24U (e.g., a plurality of function pads 24U but no non-function pads 24NU) may be disposed in the overlapping chip edge region CER. The function pad 24U and the non-function pad 24NU may be disposed in the chip attach region CSR. In some embodiments, only a function pad 24U (e.g., a plurality of function pads 24U but no non-function pads 24NU) may be disposed in the chip attach region CSR. A function pad 24U, a non-function pad 24NU, and a non-contact pad 24NC may be disposed in the peripheral region PER. In some embodiments, at least one of the non-function pad 24NU and the non-contact pad 24NC may not be disposed in the peripheral region PER (e.g., the peripheral region PER may not include any non-function pads 24NU or may not include any non-contact pads 24C). As can be seen from above, certain items are described in the singular but will be present in a device in plural. In addition, FIG. 9A shows only one row of pads—other rows of pads may be similar type pads or different layouts from that shown in FIG. 9A, as can be seen from FIG. 7.

The function pad 24U included in the package base substrate 10a may be the first connection pad 24A (e.g., from FIG. 8A), the non-function pad 24NU may be the fourth connection pad 24D (e.g., from FIG. 8D), and the non-contact pad 24NC may be the fifth connection pad 24E (e.g., from FIG. 8E). Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Because the function pad 24U is the first connection pad 24A having a connection reinforcement portion including an extension line portion LNPa and a corner reinforcement portion TDPa, it is possible to prevent a crack from occurring between the first connection pad 24A and the lower surface wiring pattern LP.

Referring to FIG. 9B, a package base substrate 10b may have an overlapping chip edge region CER, a chip attach region CSR, and a peripheral region PER. The package base substrate 10b may be the package substrate 10 described with reference to FIGS. 1A to 7.

A function pad 24U disposed in the overlapping chip edge region CER included in the package base substrate 10b may be the second connection pad 24B (e.g., from FIG. 8B), a function pad 24U disposed in the chip attach region CSR and the peripheral region PER may be the first connection pad 24A, a non-functional pad 24NU may be the fourth connection pad 24D, and a non-contact pad 24NC may be the fifth connection pad 24E.

Because the function pad 24U disposed in the overlapping chip edge region CER is the second connection pad 24B having the connection reinforcement portion including the extension line portion LNPb and the corner reinforcement portion TDPb, it is possible to prevent a crack from occurring between the second connection pad 24B and the lower surface wiring pattern LP. Because the function pad 24U disposed in the chip attach region CSR is the first connection pad 24A having the connection reinforcement portion including the extension line portion LNPa and the corner reinforcement portion TDPa, it is possible to prevent a crack from occurring between the first connection pad 24A and the lower surface wiring pattern LP.

More stress may be applied to the overlapping chip edge region CER than a portion of the chip attach region CSR, that is, the portion of the chip attach region CSR excluding the overlapping chip edge region CER. Because the connection reinforcement portion of the second connection pad 24B has a greater area and a greater extension length than the connection reinforcement portion of the first connection pad 24A, even when relatively more stress is applied to the second connection pad 24B than the first connection pad 24A, it is possible to prevent a crack from occurring between the second connection pad 24B and the lower surface wiring pattern LP.

Referring to FIG. 9C, a package base substrate 10c may have an overlapping chip edge region CER, a chip attach region CSR, and a peripheral region PER. The package base substrate 10*c* may be the package substrate 10 described with reference to FIGS. 1A to 7.

A function pad 24U disposed in the overlapping chip edge region CER included in the package base substrate 10*c* may be the third connection pad 24C (e.g., from FIG. 8C), a function pad 24U disposed in the chip attach region CSR and the peripheral region PER may be the first connection pad 24A, a non-functional pad 24NU may be the fourth connection pad 24D, and a non-contact pad 24NC may be the fifth connection pad 24E.

Because the function pad 24U disposed in the overlapping chip edge region CER is the third connecting pad 24C having the connecting reinforcing portion including the extension line portion LNPc, the corner reinforcing portion TDPc, and the bulging reinforcing portion DEP, it is possible to prevent a crack from occurring between the third connection pad 24C and the lower surface wiring pattern LP. Because the function pad 24U disposed in the chip attaching region CSR is the first connection pad 24A having the connection reinforcement portion including the extension line portion LNPa and the corner reinforcement portion TDPa, it is possible to prevent a crack from occurring between the first connection pad 24A and the lower surface wiring pattern LP.

More stress may be applied to the overlapping chip edge region CER than a portion of the chip attach region CSR, that is, the chip attach region CSR, excluding the overlapping chip edge region CER. Because the connection reinforcement portion of the second connection pad 24C has the bulge reinforcement portion DEP, the connection reinforcement portion of the second connection pad 24C has a greater area than the connection reinforcement portion of the first connection pad 24A. And thus, even when relatively more stress is applied to the third connection pad 24C than the first connection pad 24A, it is possible to prevent a crack from occurring between the third connection pad 24C and the lower surface wiring pattern LP.

Referring to FIG. 9D, a package base substrate 10*d* may have an overlapping chip edge region CER, a chip attach region CSR, and a peripheral region PER. The package base substrate 10*d* may be the package substrate 10 described with reference to FIGS. 1A to 7.

A function pad 24U disposed in the overlapping chip edge region CER included in the package base substrate 10*d* may be the third connection pad 24C, a function pad 24U disposed in the chip attach region CSR may be the second connection pad 24B, a function pad 24U disposed in the peripheral region PER may be the first connection pad 24A, a non-function pad 24NU may be a fourth connection pad 24D, and a non-contact pad 24NC disposed in the peripheral region PER may be the fifth connection pad 24E.

Referring to FIG. 9E, a package base substrate 10*e* may have an overlapping chip edge region CER, a chip attach region CSR, and a peripheral region PER. The package base substrate 10*e* may be the package substrate 10 described with reference to FIGS. 1A to 7.

A function pad 24U disposed in the overlapping chip edge region CER included in the package base substrate 10*e* and a function pad 24U disposed in the chip attaching region CSR may be the first connection pads 24A, a function pad 24U and the non-function pad 24NU disposed in the peripheral region PER may be the fourth connection pad 24D, and a non-contact pad 24NC may be the fifth connection pad 24E.

Referring to FIG. 9F, a package base substrate 10*f* may have an overlapping chip edge region CER, a chip attach region CSR, and a peripheral region PER. The package base substrate 10*f* may be the package substrate 10 described with reference to FIGS. 1A to 7.

A function pad 24U disposed in the overlapping chip edge region CER included in the package base substrate 10*f* may be the third connection pad 24C, a function pad 24U disposed in the chip attach region CSR may be the first connection pad 24A, a function pad 24U and a non-function pad 24NU disposed in the peripheral area PER may be the fourth connection pad 24D, and a non-contact pad 24NC disposed in the peripheral area PER may be the fifth connection pad 24E.

Referring to FIG. 9G, a package base substrate 10*g* may have an overlapping chip edge region CER, a chip attach region CSR, and a peripheral region PER. The package base substrate 10*g* may be the package substrate 10 described with reference to FIGS. 1A to 7.

A function pad 24U disposed in the overlapping chip edge region CER included in the package base substrate 10*g* may be the first connection pad 24A, a function pad 24U disposed in the chip attach region CSR, a function pad 24U and a non-functional pad 24NU disposed in the peripheral region PER may be the fourth connection pad 24D, and a non-contact pad 24NC disposed in the peripheral region PER may be the fifth connection pad 24E.

Referring to FIG. 9H, a package base substrate 10*h* may have an overlapping chip edge region CER, a chip attach region CSR, and a peripheral region PER. The package base substrate 10*h* may be the package substrate 10 described with reference to FIGS. 1A to 7.

A function pad 24U disposed in the overlapping chip edge region CER included in the package base substrate 10*h* may be the third connection pad 24C, a function pad 24U disposed in the chip attach region CSR and a function pad 24U and a non-function pad 24NU disposed in the peripheral region PER may be the fourth connection pad 24D, and a non-contact pad 24NC disposed in the peripheral region PER may be the fifth connection pad 24E.

Referring to FIG. 9I, a package base substrate 10*i* may have an overlapping chip edge region CER, a chip attach region CSR, and a peripheral region PER. The package base substrate 10*i* may be the package substrate 10 described with reference to FIGS. 1A to 7.

A function pad 24U and a non-function pad 24NU included in the package base substrate 10*i* may be the first connection pad 24A, and a non-contact pad 24NC may be the fifth connection pad 24E.

Referring to 9J, a package base substrate 10*j* may have an overlapping chip edge region CER, a chip attach region CSR, and a peripheral region PER. The package base substrate 10*j* may be the package substrate 10 described with reference to FIGS. 1A to 7.

A function pad 24U disposed in the overlapping chip edge region CER included in the package base substrate 10*j* may be the second connection pad 24B, a function pad 24U disposed in the chip attach region CSR, a function pad 24U and a non-function pad 24NU disposed in the peripheral region PER may be the first connection pad 24A, and a non-contact pad 24NC disposed in the peripheral region PER may be the fifth connection pad 24E.

Referring to FIG. 9K, a package base substrate 10*k* may have an overlapping chip edge region CER, a chip attach region CSR, and a peripheral region PER. The package base substrate 10*k* may be the package substrate 10 described with reference to FIGS. 1A to 7.

A function pad 24U disposed in the overlapping chip edge region CER included in the package base substrate 10*k* may be the third connection pad 24C, a function pad 24U disposed in the chip attach region CSR, a function pad 24U, a non-function pad 24NU disposed in the peripheral region PER may be the first connection pad 24A, and a non-contact pad 24NC disposed in the peripheral region PER may be the fifth connection pad 24E.

Referring to FIG. 9L, the package base substrate 101 may have an overlapping chip edge region CER, a chip attach region CSR, and a peripheral region PER. The package base substrate 101 may be the package substrate 10 described with reference to FIGS. 1A to 7.

A function pad 24U disposed in the overlapping chip edge region CER included in the package base substrate 101 may be the third connection pad 24C, the function pad 24U disposed in the chip attach region CSR may be the second connection pad 24B, a function pad 24U and a non-functional pad 24NU disposed in the peripheral area PER may be the first connection pad 24A, and a non-contact pad 24NC disposed in the peripheral area PER may be the fifth connection pad 24E.

Referring to FIG. 9M, a package base substrate 10m may have an overlapping chip edge region CER, a chip attach region CSR, and a peripheral region PER. The package base substrate 10m may be the package substrate 10 described with reference to FIGS. 1A to 7.

A function pad 24U disposed in the overlapping chip edge region CER included in the package base substrate 10m may be the third connection pad 24C, a function pad 24U disposed in the chip attach region CSR and the function pad 24U disposed in the peripheral region PER may be the second connection pads 24B, a non-function pad 24NU may be the first connection pad 24A, and a non-contact pad 24NC disposed in the peripheral region PER may be the fifth connection pad 24E.

Referring to FIG. 9N, a package base substrate 10n may have an overlapping chip edge region CER, a chip attach region CSR, and a peripheral region PER. The package base substrate 10n may be the package substrate 10 described with reference to FIGS. 1A to 7.

A function pad 24U disposed in the overlapping chip edge region CER included in the package base substrate 10n and the function pad 24U disposed in the chip attaching region CSR may be the third connection pad 24C, the function pad 24U disposed in the peripheral area PER may be the second connection pad 24B, a non-function pad 24NU may be the first connection pad 24A, a non-contact pad 24NC disposed in the peripheral area PER may be the fifth connection pad 24E.

Referring to FIG. 9O, a package base substrate 10o may have an overlapping chip edge region CER, a chip attach region CSR, and a peripheral region PER. The package base substrate 10o may be the package substrate 10 described with reference to FIGS. 1A to 7.

A function pad 24U included in the package base substrate 10o may be the third connection pad 24C, and a non-function pad 24NU may be the first connection pad 24A, and the non-contact pad 24NC may be the fifth connection pad 24E.

Referring to FIG. 9P, the package base substrate 10p may have an overlapping chip edge region CER, a chip attach region CSR, and a peripheral region PER. The package base substrate 10p may be the package substrate 10 described with reference to FIGS. 1A to 7.

A function pad 24U and a non-function pad 24NU included in the package base substrate 10p may be the third connection pad 24C, and a non-contact pad 24NC may be the fifth connection pad 24E.

Referring to FIGS. 1A to 9P together, in the package base substrate 10, 10a, 10b, 10c, 10d, 10e, 10f, 10g, 10h, 10i, 10j, 10k, 10l, 10m, 10n, 10o, and 10p and the semiconductor package 1, 1a, 1b, 1c, 2, 3a, 3b, 4, and 5 including the same, according to the inventive concept, each of the plurality of lower surface connection pads 24 may be one of the first connection pad 24A, the second connection pad 24B, the third connection pad 24C, the fourth connection pad 24D, and the fifth connection pad 24E. For example, the lower surface connection pad 24 to which a relatively large amount of stress is applied may be formed to have a relatively great area, and the lower surface connection pad 24 to which a relatively small stress is applied may be formed to have a relatively small area. Accordingly, the package base substrates 10, 10a, 10b, 10c, 10d, 10e, 10f, 10g, 10h, 10i, 10j, 10k, 10l, 10m, 10n, 10o, and 10p may have stress resistance and, at the same time, have a degree of freedom in designing the lower surface wiring pattern LP.

While the inventive concept has been particularly shown and described with reference to embodiments thereof, it will be understood that various changes in form and details may be made therein without departing from the spirit and scope of the following claims.

What is claimed is:

1. A package base substrate comprising:
   a base layer;
   a plurality of lower surface connection pads disposed on a lower surface of the base layer;
   a plurality of lower surface wiring patterns disposed on the lower surface of the base layer and respectively connected to a set of lower surface connection pads of the plurality of lower surface connection pads; and
   a lower surface solder resist layer covering a portion of each of the plurality of lower surface connection pads and the plurality of lower surface wiring patterns on the lower surface of the base layer,
   wherein each of at least some of the lower surface connection pads of the set of lower surface connection pads has a teardrop shape in a plan view, and includes:
      a ball land portion having a planar circular shape, including a terminal contact portion exposed without being covered by the lower surface solder resist layer, and an edge portion surrounding the terminal contact portion and covered by the lower surface solder resist layer; and
      a connection reinforcement portion between the ball land portion and a corresponding lower surface wiring pattern of the plurality of lower surface wiring patterns, the connection reinforcement portion including an extension line portion having a width that is the same as a line width of the corresponding lower surface wiring pattern and extending from the corresponding ball land portion to the corresponding lower surface wiring pattern, and a corner reinforcement portion filling a corner between the corresponding ball land portion and the extension line portion, and
   wherein an extension length of the extension line portion has a value greater than a radius of the terminal contact portion.

2. The package base substrate of claim 1, wherein the connection reinforcement portion includes one extension line portion and two corner reinforcement portions, one on each side of the one extension line portion.

3. The package base substrate of claim 2, wherein, among outer edges of the two corner reinforcement portions, two outer extension lines meet each other while forming a line intersection angle less than 90°, wherein the two outer extension lines are straight lines connecting a portion connected to respective edges of the ball land portion to a portion connected to an end of the corresponding lower surface wiring pattern.

4. The package base substrate of claim 3, wherein two inner extension lines, which are straight lines connecting the portion of the outer edges of the two corner reinforcement portions connected to the respective edges of the ball land portion to a center point of the ball land portion, meet each other while forming a land intersection angle greater than the line intersection angle.

5. The package base substrate of claim 4, wherein the land intersection angle is about 100° to about 140°.

6. The package base substrate of claim 3, wherein:
the lower surface connection pads having the teardrop shape include a first connection pad and a second connection pad,
an outer edge of each corner reinforcement portion of the first connection pad extends in a straight line, and
the connection reinforcement portion of the second connection pad includes a bulging reinforcement portion disposed outside of the corner reinforcement portions so that the connection reinforcement portion has an outwardly bulging shape.

7. The package base substrate of claim 1, wherein:
the lower surface connection pads having the teardrop shape include a first connection pad and a second connection pad,
radii of the terminal contact portion of the first connection pad and the second connection pad have the same value as each other, and
extension lengths of the extension line portions of the first connection pad and the second connection pad are different from each other.

8. A package base substrate comprising:
at least one base layer;
a plurality of upper surface connection pads disposed on an upper surface of the at least one base layer and electrically connected to a first semiconductor chip and a second semiconductor chip stacked on the first semiconductor chip;
a plurality of lower surface connection pads disposed on a lower surface of the at least one base layer and to which a plurality of external connection terminals are respectively attached;
a plurality of lower surface wiring patterns disposed on the lower surface of the at least one base layer and respectively connected to a set of lower surface connection pads of the plurality of lower surface connection pads; and
a lower surface solder resist layer covering the lower surface of the at least one base layer and exposing a portion of each of the plurality of lower surface connection pads by not covering the portion of each of the plurality of lower surface connection pads,
wherein the package base substrate has a chip attach region including an adhering region to which the first semiconductor chip is attached and a portion around the adhering region, and a peripheral region surrounding the chip attach region,
wherein the plurality of lower surface connection pads include a plurality of function pads, at least one non-function pad, and at least one non-contact pad,
wherein each of the plurality of lower surface connection pads has a ball land portion having a planar circular shape, including a terminal contact portion exposed without being covered by the lower surface solder resist layer, and an edge portion surrounding the terminal contact portion and covered by the lower surface solder resist layer,
wherein among the plurality of function pads, at least one function pad is disposed in the chip attach region and includes a first connection reinforcement portion between a corresponding ball land portion and a corresponding lower surface wiring pattern of the plurality of lower surface wiring patterns, the first connection reinforcement portion including a first extension line portion and a first corner reinforcement portion filling a corner between the corresponding ball land portion and the first extension line portion, and
wherein a first extension length of the first extension line portion has a value greater than a radius of the terminal contact portion.

9. The package base substrate of claim 8,
wherein at least one function pad is disposed in the peripheral region among the plurality of function pads, and includes a second connection reinforcement portion between a corresponding ball land portion and a corresponding lower surface wiring pattern of the plurality of lower surface wiring patterns, the second connection reinforcement portion including a second extension line portion and a second corner reinforcement portion filling a corner between the corresponding ball land portion and the second extension line portion, and
wherein a second extension length of the second extension line portion has a value greater than a radius of the terminal contact portion, but has a value less than the first extension length.

10. The package base substrate of claim 8, wherein a function pad is disposed in the peripheral region among the plurality of function pads and is configured such that a corresponding ball land portion and a corresponding lower surface wiring pattern are directly connected to each other.

11. The package base substrate of claim 8, wherein the first connection reinforcement portion further includes a bulging reinforcement portion disposed on the outside of the first corner reinforcement portion so that the first connection reinforcement portion has an outwardly bulging shape.

12. The package base substrate of claim 8, wherein the at least one non-contact pad has an island shape not connected to the plurality of lower surface wiring patterns.

13. The package base substrate of claim 8, wherein, among the plurality of function pads, at least one function pad is disposed in the chip attach region and has an area greater than that of a function pad disposed in the peripheral region.

14. The package base substrate of claim 8, wherein each of the plurality of function pads has a greater area than that of the at least one non-function pad.

15. The package base substrate of claim 8, wherein each terminal contact portion has a radius of about 200 μm to about 300 μm, and a line width of each of the plurality of lower surface wiring patterns is about 25 μm to about 50 μm.

16. The package base substrate of claim 8, wherein
each first connection reinforcement portion includes one first extension line portion and two first corner reinforcement portions, one on each side of the one first extension line portion, and
two inner extension lines, which are straight lines connecting a portion connected to an edge of the ball land portion to a center point of the ball land portion among outer edges of the two first corner reinforcement portions, meet each other while forming an intersection angle of about 100° to about 140°.

17. A semiconductor package comprising:

a package base substrate having a chip attach region and a peripheral region surrounding the chip attach region; and a plurality of semiconductor chips including a first semiconductor chip that is the lowermost and is attached to the package base substrate at the chip attach region and a second semiconductor chip that is the second lowermost and is attached to the first semiconductor chip, wherein the package base substrate includes at least one base layer;

a plurality of upper surface connection pads disposed on an upper surface of the at least one base layer and electrically connected to the plurality of semiconductor chips;

a plurality of lower surface connection pads disposed on a lower surface of the at least one base layer;

a plurality of lower surface wiring patterns disposed on the lower surface of the at least one base layer and respectively connected to a set of the plurality of lower surface connection pads;

a lower surface solder resist layer covering the lower surface of the at least one base layer and exposing a portion of each of the plurality of lower surface connection pads by not covering the portion of each of the plurality of lower surface connection pads, wherein at least some of the plurality of lower surface connection pads of the set of the plurality of lower surface connection pads have a teardrop shape in a plan view and include:

a ball land portion having a planar circular shape, including a terminal contact portion exposed without being covered by the lower surface solder resist layer, and an edge portion surrounding the terminal contact portion and covered by the lower surface solder resist layer; and a connection reinforcement portion between the ball land portion and a corresponding lower surface wiring pattern, including an extension line portion having the same width as a line width of the corresponding lower surface wiring pattern and extending from the ball land portion to the corresponding lower surface wiring pattern, and two corner reinforcement portions, each filling a corner between the ball land portion and the extension line portion on a respective side of the extension line portion, and wherein an extension length of the extension line portion has a value greater than a radius of the terminal contact portion.

18. The semiconductor package of claim 17, wherein the extension length of the extension line portion included in some of the plurality of lower surface connection pads, which are disposed in the chip attach region, is greater than an extension length of the extension line portion included in some of the plurality of lower surface connection pads, which are disposed in the peripheral region.

19. The semiconductor package of claim 17, wherein some of the lower surface connection pads having the connection reinforcement portion further include two bulging reinforcement portions disposed outside the two corner reinforcement portions so that the connection reinforcement portion has an outwardly bulging shape.

20. The semiconductor package of claim 17, wherein some of the set of the plurality of lower surface connection pads do not include the connection reinforcement portion, and include a corresponding ball land portion and a corresponding lower surface wiring pattern, which are directly connected.

* * * * *